(12) United States Patent
Segawa et al.

(10) Patent No.: US 6,638,564 B2
(45) Date of Patent: Oct. 28, 2003

(54) METHOD OF ELECTROLESS PLATING AND ELECTROLESS PLATING APPARATUS

(75) Inventors: Yuji Segawa, Tokyo (JP); Akira Yoshio, Tokyo (JP); Masatoshi Suzuki, Kanagawa (JP); Katsumi Watanabe, Kanagawa (JP); Shuzo Sato, Kanagawa (JP)

(73) Assignee: Sony Corporation (JP)

( * ) Notice: Subject to any disclaimer, the term of this patent is extended or adjusted under 35 U.S.C. 154(b) by 53 days.

(21) Appl. No.: 09/827,936

(22) Filed: Apr. 9, 2001

(65) Prior Publication Data

US 2002/0036143 A1 Mar. 28, 2002

(30) Foreign Application Priority Data

Apr. 10, 2000 (JP) .......................................... 2000-113268
Sep. 1, 2000 (JP) .......................................... 2000-269893

(51) Int. Cl.$^7$ .............................. B05D 3/12; B05D 1/18; B05D 1/02; B05D 3/10
(52) U.S. Cl. .............................. 427/8; 427/98; 427/123; 427/304; 427/305; 427/306; 427/240; 427/346; 427/347; 427/437; 427/438; 427/443.1; 427/427
(58) Field of Search ............................ 427/8, 304, 305, 427/306, 240, 346, 347, 437, 438, 443.1, 96, 98, 123, 427

(56) References Cited

U.S. PATENT DOCUMENTS

| | | | | | |
|---|---|---|---|---|---|
| 4,894,260 | A | * | 1/1990 | Kumasaka et al. | 427/241 |
| 5,240,497 | A | * | 8/1993 | Shacham et al. | 106/1.26 |
| 5,364,459 | A | * | 11/1994 | Senda et al. | 106/1.22 |
| 5,571,560 | A | * | 11/1996 | Lin | 427/240 |
| 5,695,810 | A | * | 12/1997 | Dubin et al. | 427/96 |
| 6,065,424 | A | * | 5/2000 | Shacham-Diamand et al. | 118/696 |
| 6,323,128 | B1 | * | 11/2001 | Sambucetti et al. | 438/678 |

* cited by examiner

*Primary Examiner*—Michael Barr
(74) *Attorney, Agent, or Firm*—Rader, Fishman & Grauer PLLC; Ronald P. Kananen

(57) ABSTRACT

A method of electroless plating for processing a plating surface to form a barrier layer being capable of uniformly forming a barrier layer and reducing the consumption of a processing solution, comprising a step of feeding a processing solution used in at least one of the pre-processing steps of the electroless plating and the electroless plating step to the plating surface for puddling treatment, or, using a processing solution at least containing, with respect to one mole of a first metallic material supplying a main ingredient of the barrier layer, three or more moles of a completing agent and three or more moles of reducing agent and having a pH value adjusted to 9 or more and stored in an atmosphere of an inert gas or ammonia gas, and a corresponding electroless plating apparatus.

49 Claims, 14 Drawing Sheets

METHOD OF ELECTROLESS PLATING AND ELECTROLESS PLATING APPARATUS

BACKGROUND OF THE INVENTION

1. Field of the Invention

The present invention relates to a method of electroless plating and an electroless plating apparatus, more particularly relates to a method of electroless plating and an electroless plating apparatus for forming a conductive film having a barrier ability.

2. Description of the Related Art

Aluminum or aluminum alloys have been widely used as materials of miniaturized interconnections in semiconductor devices obtained by forming highly integrated circuits on semiconductor wafers.

In order to further increase the operating speed of semiconductor devices, however, it is necessary to use materials of lower resistivity such as copper, silver, etc. for the interconnections.

Especially, copper has a resistivity as low as 1.8 $\mu\Omega$cm, which is advantageous to increase the speed of semiconductor devices, and is 10 times higher in electromigration resistance than aluminum alloys, thus is attracting more and more attention as a next generation material.

Copper, however, is liable to diffuse into the silicon oxide and other insulating materials. The diffusion speed is also high. Thereupon, when using copper for interconnections, as a measure against this problem, usually a barrier metal layer is formed at the boundary between the copper and the insulating material to prevent the diffusion of copper.

Materials frequently used for a barrier metal layer include tantalum, tantalum nitride, titanium, titanium nitride, tungsten, tungsten nitride, etc.

Conventionally, a barrier metal layer was usually formed by a physical vapor deposition (PVD) method such as sputtering or by a chemical vapor deposition (CVD) method.

Together with the increasing compactness and higher integration of semiconductor devices, the interconnection design rule has already been reduced to under the 0.13 $\mu$m. Further, while the silicon oxide or other interlayer insulating films which cover semiconductor elements are becoming thicker along with the increased heights of these elements, the area for opening connection holes (contact holes and via holes for electrical connections between elements or between multi-layer interconnections) is becoming smaller. As a result, the aspect ratio of connection holes is becoming a high ratio of over 1:5. In view of this situation, the coverage provided by a barrier metal layer formed by the PVD or CVD method is becoming poorer. It is extremely difficult to form a uniform film covering up to the inside surfaces of connection holes.

To solve this problem, U.S. Pat. No. 5,695,810 discloses a technique for forming a barrier metal layer of CoWP by means of electroless plating.

In addition, Japanese Unexamined Patent Publication (Kokai) No. 8-83796 discloses another technique of forming a film of cobalt, nickel, etc. by electroless plating.

In the above methods, electroless plating for depositing a CoWP layer was carried out by dipping. In this case, however, the solution for electroless plating (electroless plating processing solution) easily forms Co(OH)$_2$ precipitates. Furthermore, if a reducing agent is added into the processing solution beforehand, a reduction reaction takes place induced by the reducing agent, resulting in not only a shorter lifetime of the electroless plating processing solution, but also a difference in the rate of film formation because of the aging of the processing solution from the beginning to the end of its lifetime.

Because of the short lifetime, each time an electroless plating processing solution deteriorates, a new solution has to be prepared. This causes increased solution consumption, much extra work in fabrication, and higher fabrication costs. Consequently, application of these techniques is not easy.

Furthermore, when applied to semiconductors, sodium hydroxide containing alkali metal ions cannot be used to adjust the pH value of the electroless plating processing solution. Therefore, ammonia is employed for this purpose. Ammonia is however highly volatile, thus causes the lifetime of the solution to become shorter. In addition, when ammonium tungstate or ammonium molybdate is added into the electroless plating processing solution to improve the barrier ability of the formed barrier metal film, due also to the volatilization of ammonia, tungstic acid or molybdic acid ends up precipitating, so the lifetime of the processing solution again becomes short.

When using processing solutions for pre-processing for the above electroless plating treatment as well, it is desired to reduce the consumption of the processing solution from that when feeding processing solutions to plating surfaces by a spin-coat method.

SUMMARY OF THE INVENTION

An object of the present invention is to provide a method of electroless plating and an electroless plating apparatus for forming a barrier layer by electroless plating able to stably and uniformly form a film even when interconnections and connection holes are miniaturized and have large aspect ratios and able to reduce the consumption of a processing solution by increasing its lifetime.

To attain the above object, according to a first aspect of the present invention, there is provided a method of electroless plating for processing a plating surface to form a barrier layer, comprising a step of feeding a processing solution used in at least one of the pre-processing steps of the electroless plating and the electroless plating step to the plating surface for puddling treatment.

In the above method of electroless plating of the present invention, preferably puddling treatment is performed by the processing solution used in the electroless plating step.

In addition, preferably, puddling treatment is performed by a processing solution used in at least one of the pre-processing steps of hydrophilization, coupling, catalyzation, and activation. Alternatively, puddling treatment is performed by a processing solution used in at least one of the pre-processing steps of degreasing, acid neutralization, and catalyzation. The catalyzation is a substitution processing induced by palladium, platinum, gold, rhodium, or another catalytic metal.

The above method of electroless plating of the present invention preferably includes a step of removing an unnecessary processing solution after the puddling treatment.

In addition, preferably, the processing solution is fed by a spin-coater, then the spin-coater is stopped for the puddling treatment with the processing solution, then the spin-coated is again operated to remove the unnecessary processing solution.

In addition, preferably, the puddling treatment step and the step of removing an unnecessary processing solution are repeated.

In the above method of electroless plating of the present invention, preferably the puddling treatment is performed by a processing solution including at least a first metallic material supplying a main ingredient of the barrier layer, a completing agent, a reducing agent, and a pH adjusting agent and having a pH value adjusted in a region from neutral to alkali as the processing solution of the electroless plating step.

More preferably, as the processing solution, use is made of a processing solution further including a second metallic material supplying an ingredient enhancing the barrier ability of the barrier layer.

In addition, more preferably, the complexing agent includes a first complexing agent of an amphoteric ion type and a second complexing agent for enhancing a plating reaction.

In the above method of electroless plating of the present invention, preferably the processing solution is prepared divided into a first solution including at least the first metallic material and the complexing agent and a second solution including the reducing agent, and the first and second solutions are mixed to obtain the processing solution before feeding to the plating surface.

More preferably, the second solution includes a second metallic material supplying an ingredient enhancing the barrier ability of the barrier layer.

In addition, more preferably, after the first and second solutions are mixed, the mixed solution is immediately fed to the plating surface.

In addition, more preferably, the first and second solutions are stored in an atmosphere of a nitrogen gas or other inert gases or ammonia gas or alternatively in a pressurized atmosphere of an inert gas or ammonia gas until feeding said processing solution to the plating surface.

In the above method of electroless plating of the present invention, preferably the processing solution is prepared divided into a first solution including the first metallic material and the complexing agent, a second solution including the reducing agent, and a third solution including the second metallic material, and the first, second, and third solutions are mixed to obtain the processing solution before feeding to the plating surface.

More preferably, the first, second, and third solutions are stored in an atmosphere of an inert gas or ammonia gas or alternatively in a pressurized atmosphere of an inert gas or ammonia gas until feeding said processing solution to the plating surface.

In the above method of electroless plating of the present invention, the first metallic material includes at least a compound of nickel or cobalt.

In addition, preferably the second metallic material includes at least a compound of tungsten or molybdenum, more preferably the atomic weight concentration of the tungsten or molybdenum is 0.2% to 2%.

In addition, preferably the first complexing agent is an amino acid.

In addition, preferably, the second complexing agent is an organic acid.

In addition, preferably the complexing agent, the reducing agent, and the pH adjusting agent substantially do not contain a metal in their chemical formulae.

In the above method of electroless plating of the present invention, the pH value of the processing solution is adjusted to 7 to 12. If the processing solution includes the second metallic material, the pH value of the processing solution is adjusted to 8 to 12.

More preferably, when the processing solution is prepared divided among several tanks, the pH value is adjusted to 7 to 12 in each tank. If the processing solution includes the second metallic material, the pH value is adjusted to 8 to 12 in each tank.

In addition, preferably the temperature of the processing solution is adjusted to 50° C. to 95° C.

More preferably, when the processing solution is prepared divided among several tanks, the temperature is adjusted to 50° C. to 95° C. in each tank.

In addition, preferably the processing solution is sprayed onto the plating surface by a spray nozzle.

In the above method of electroless plating of the present invention, preferably, as the processing solution of the electroless plating step, use is made of a processing solution containing, with respect to one mole of the first metallic material, three or more moles of the complexing agent and three or more moles of the reducing agent.

More preferably, as the processing solution of the electroless plating step, use is made of a processing solution of a pH value adjusted to 9 or more.

In addition, more preferably, the pH value of the processing solution of the electroless plating step is monitored and, when the pH value is less than 9, the pH adjusting agent is further added to increase the pH value to 9 or more.

In the above method of electroless plating of the present invention, since a barrier film is formed by electroless plating, the barrier film can be stably and uniformly formed even when interconnections and connection holes are miniaturized and have large aspect ratios. Further, because a processing solution is fed to the plating surface for puddling treatment in at least one of the pre-processing steps of electroless plating and the electroless plating step, the consumption of the processing solution can be reduced.

In particular, a processing solution is shortened in lifetime due to precipitation of $Co(OH)_2$, occurrence of reduction reactions induced by an addition of a reducing agent into the processing solution, or volatilization of ammonia. In the method of electroless plating of the present invention, however, up until immediately before feeding the processing solution to the plating surface, the processing solution is divided into the first solution including a first metallic material and a complexing agent and the second solution including a reducing agent. These are stored in an atmosphere of a nitrogen gas or another inert gas or ammonia gas to prevent volatilization of ammonia and oxidation in the solution. By mixing the first and second solutions and immediately feeding the resultant processing solution to the plating surface, the lifetime of the processing solution can be extended and the consumption can be reduced.

Dividing and storing the processing solution in this way up until just before use becomes possible by adoption of the above puddling treatment of the processing solution.

Particularly, by making the molar ratio of the electroless plating processing solution three or more moles of complexing agent and three or more moles of reducing agent to one mole of the first metallic material, a film is able to be formed stably and uniformly by electroless plating. Further, with the pH value not less than 9, a dense and high quality plating film giving a lustrous surface can be formed.

In addition, by controlling the pH value to 9 or more at the above composition, fluctuation of the composition of the processing solution due to precipitation is prevented and therefore the lifetime of the processing solution can be extended. Furthermore, the amount of waste of the processing solution and therefore the consumption of the processing solution can be reduced.

In addition, to achieve the above object, according to a second aspect of the present invention, there is provided a method of electroless plating for processing a plating surface to form a barrier layer, wherein a processing solution of an electroless plating step contains, with respect to one mole of a first metallic material, three or more moles of a complexing agent, three or more moles of a reducing agent, and a pH adjusting agent, and the pH value of the processing solution is adjusted in the region from neutral to alkali.

In the above method of electroless plating of the present invention, preferably, as the processing solution of the electroless plating step, use is made of a processing solution of a pH value adjusted to 9 or more.

More preferably, the pH value of the processing solution of the electroless plating step is monitored and the pH adjusting agent is further added to increase the pH value to 9 or more when the pH value becomes less than 9.

In the above method of electroless plating of the present invention, as the pre-processing of the electroless plating, hydrophilization, coupling, catalyzation, and activation are performed.

Alternatively, preferably, as the pre-processing of the electroless plating, degreasing, acid neutralization, and catalyzation are performed.

In the above method of electroless plating of the present invention, preferably, as the processing solution, use is made of a processing solution further including a second metallic material supplying an ingredient enhancing the barrier ability of the barrier layer.

In addition, the completing agent preferably includes a first complexing agent of an amphoteric ion type and a second complexing agent for enhancing a plating reaction.

In the above method of electroless plating of the present invention, preferably the processing solution is stored in an atmosphere of a nitrogen gas or other inert gases or ammonia gas until feeding said processing solution to the plating surface.

In addition, preferably the processing solution is fed to the plating surface in a pressurized atmosphere of an inert gas or ammonia gas.

In the above method of electroless plating of the present invention, more preferably the first metallic material includes at least a compound of nickel or cobalt.

In addition, the second metallic material includes at least a compound comprising 0.2% to 2% tungsten or molybdenum by atomic weight concentration.

In addition, preferably the first complexing agent is an amino acid.

In addition, preferably the second complexing agent is an organic acid.

In addition, preferably the completing agent, the reducing agent, and the pH adjusting agent substantially do not contain a metal in their chemical formulae.

In the above method of electroless plating of the present invention, the temperature of the processing solution is adjusted to 50° C. to 95° C.

In the above method of electroless plating of the present invention, by setting the molar ratio of the processing solution for the electroless plating to three or more moles of complexing agent and three or more moles of reducing agent to one mole of the first metallic material, a film is able to be formed stably and uniformly by electroless plating.

Furthermore, with a pH value not less than 9, a dense and high quality plating film giving a lustrous surface can be formed.

In addition, by controlling the pH value to 9 or more at the above composition, storing the processing solution in an atmosphere of a nitrogen or other inert gas or ammonia gas, and feeding the processing solution to the plating surface in a pressurized atmosphere of an inert gas or ammonia gas, the fluctuation of the composition of the processing solution due to precipitation is prevented, the lifetime of the processing solution can be extended, and the waste of the processing solution and therefore the consumption of the processing solution can be reduced.

In addition, to achieve the above object, according to a third aspect of the present invention, there is provided an electroless plating apparatus for processing a plating surface to form a barrier layer, comprising a table for fixing a plating object having a plating surface and a feeding means for feeding a processing solution to the plating surface in at least one of the pre-processing steps of electroless plating and the electroless plating step, wherein stopping the table enables puddling treatment by the processing solution.

In the above electroless plating apparatus of the present invention, preferably the feeding means feeds a processing solution used for the electroless plating step.

Alternatively, the feeding means feeds a processing solution used in at least one of the pre-processing steps of hydrophilization, coupling, catalyzation, and activation or the feeding means feeds a processing solution used in at least one of the pre-processing steps of degreasing, acid neutralization, and catalyzation.

The above electroless plating apparatus of the present invention preferably further comprises a means for removing an unnecessary processing solution.

More preferably, the table, feeding means, and removing means are comprised by a spin-coater. The spin-coater feeds the processing solution, is stopped to allow the puddling treatment by the processing solution, then is operated to remove unnecessary processing solution.

In addition, more preferably, the puddling treatment step and the step of removing an unnecessary processing solution are repeated.

In the above electroless plating apparatus of the present invention, preferably, as the processing solution of electroless plating step, a processing solution including at least a first metallic material supplying a main ingredient of the barrier layer, a complexing agent, a reducing agent, and a pH adjusting agent and having a pH value adjusted in a region from neutral to alkali is fed.

More preferably, as the processing solution, a processing solution further including a second metallic material supplying an ingredient enhancing the barrier ability of the barrier layer is fed.

Further, more preferably, a processing solution containing a completing agent including a first completing agent of an amphoteric ion type and a second complexing agent for enhancing a plating reaction is fed.

The above electroless plating apparatus of the present invention preferably further comprises at least a first tank containing a first solution including the first metallic material and the complexing agent and a second tank containing a second solution including the reducing agent, wherein the processing solution can be prepared divided into at least the first and second solutions, a pipe system is provided for merging the first and second solutions before feeding them to the plating surface, and the first and second solutions are mixed there and fed as the processing solution.

More preferably, the second solution is prepared to include a second metallic material supplying an ingredient enhancing the barrier ability of the barrier layer.

Further more preferably, after the first and second solutions are mixed, the mixed solution is immediately fed to the plating surface.

In the above electroless plating apparatus of the present invention, preferably, the first and second tanks are connected to a merging tank by a pipe, and a pipe system is provided for mixing the first and second solutions in the merging tank.

In addition, preferably, a static mixer is connected downstream of a merging portion of a pipe from the first and second tanks, and a pipe system is provided for mixing the first and second solutions by the static mixer.

In addition, preferably the first and second solutions are stored in an atmosphere of an inert gas or ammonia gas in the first and second tanks. Alternatively, the first and second solutions are stored in a pressurized atmosphere of an inert gas or ammonia gas in the first and second tanks, and due to the pressurized atmosphere, the first and second solutions flow to pipes connected to the first and second tanks.

The above electroless plating apparatus of the present invention may alternatively comprise a first tank containing a first solution including the first metallic material and the complexing agent, a second tank containing a second solution including the reducing agent, and a third tank containing a third solution including the second metallic material, wherein the processing solution can be divided into at least the first, second, and third solutions, a pipe system is provided for merging the first, second, and third solutions before feeding them to the plating surface, and the first, second, and third solutions are mixed there and fed as the processing solution.

More preferably, after the first, second, and third solutions are mixed, the mixed solution is immediately fed to the plating surface.

In the above electroless plating apparatus of the present invention, preferably the first, second, and third tanks are connected to a merging tank by pipes, and a pipe system is provided for merging the first, second, and third solutions in the merging tank.

Alternatively, preferably, a static mixer is connected downstream of a merging portion of a pipe from the first, second, and third tanks, and a pipe system is provided for merging the first, second, and third solutions by the static mixer.

In addition, preferably the first, second, and third solutions are stored in an atmosphere of an inert gas or ammonia gas in the first, second, and third tanks. Alternatively, the first, second, and third solutions are stored in a pressurized atmosphere of an inert gas or ammonia gas in the first, second, and third tanks, and due to the pressurized atmosphere, the first, second, and third solutions flow to pipes connected to the first, second, and third tanks.

In the above electroless plating apparatus of the present invention, preferably, a processing solution containing a first metallic material including at least a compound of nickel or cobalt is fed.

In addition, preferably, a processing solution containing a second metallic material including at least a compound of tungsten or molybdenum is fed.

Further preferably, a processing solution containing 0.2% to 2% tungsten or molybdenum by atomic weight concentration is fed.

In addition, preferably a processing solution containing an amino acid as the first complexing agent is fed.

In addition, preferably a processing solution containing an organic acid as the second complexing agent is fed.

In addition, preferably a processing solution in which the complexing agent, the reducing agent, and the pH adjusting agent substantially do not contain a metal in their chemical formulae is fed.

In the above electroless plating apparatus of the present invention, a processing solution of a pH value adjusted to 7 to 12 is fed as the processing solution. If the processing solution includes the second metallic material, a processing solution of a pH value adjusted to 8 to 12 is fed.

More preferably, when the processing solution is prepared divided among several tanks, the pH value is adjusted to 7 to 12 in each tank. If the processing solution includes the second metallic material, the pH value is adjusted to 8 to 12 in each tank.

In addition, preferably, a heater is further provided for adjusting the temperature of the processing solution to 50° C. to 95° C.

More preferably, when the processing solution is prepared divided among several tanks, a heater is provided in each tank for adjusting the temperature in each tank to 50° C. to 95° C.

In the above electroless plating apparatus of the present invention, preferably a heater is included in the table for adjusting the temperature of the plating object.

In addition, preferably, there is further provided a heater able to be arranged to face the plating surface of the plating object. In the apparatus, the heater is arranged to face the plating surface to adjust the temperature of the processing solution in the puddling treatment step.

In addition, preferably the portion for feeding the processing solution is a spray nozzle, and the processing solution is fed by being sprayed onto the plating surface.

In the above electroless plating apparatus of the present invention, a processing solution containing, with respect to one mole the first metallic material, three or more moles of completing agent and three or more moles of reducing agent is fed by the feeding means as the processing solution in the electroless plating step.

More preferably, a processing solution of a pH value adjusted to 9 or more is fed by the feeding means as the processing solution.

In addition, more preferably, the electroless plating apparatus further comprises a processing solution tank for storing the processing solution, a measuring means for measuring the pH value of the processing solution in the processing solution tank, a pH adjusting agent tank for storing the pH adjusting agent, and a control means for adding the pH adjusting agent from the pH adjusting agent tank to the processing solution tank to increase the pH value to 9 or more when the pH value of the processing solution in the processing solution tank is less than 9.

In the above method of electroless plating of the present invention, since a barrier film is formed by electroless plating, a barrier film can be stably and uniformly formed even when interconnections and connection holes are miniaturized and have large aspect ratios. Further, by fixing a plating object having a plating surface on a table and feeding a processing solution by a feeding means to the plating surface in at least one of the pre-processing steps of electroless plating and the electroless plating step, puddling treatment by the processing solution can be performed, so the consumption of the processing solution can be reduced.

In particular, a processing solution is shortened in lifetime due to precipitation of $Co(OH)_2$, occurrence of reduction reactions induced by an addition of a reducing agent into the processing solution, or volatilization of ammonia. In the apparatus of electroless plating of the present invention, however, up until immediately before feeding the processing solution to the plating surface, the processing solution is divided into the first solution including a first metallic material and a complexing agent and the second solution including a reducing agent. These are stored in an atmosphere of a nitrogen gas or another inert gas or ammonia gas to prevent volatilization of ammonia and oxidation in the solution. By mixing the first and second solutions and immediately feeding the resultant processing solution to the plating surface, the lifetime of the processing solution can be extended and the consumption can be reduced.

Dividing and storing the processing solution in this way up until just before use becomes possible by adoption of the above puddling treatment of the processing solution.

Particularly, by making the molar ratio of the electroless plating processing solution three or more moles of complexing agent and three or more moles of reducing agent to one mole of the first metallic material, a film is able to be formed stably and uniformly by electroless plating. Further, with the pH value not less than 9, a dense and high quality plating film giving a lustrous surface can be formed.

In addition, by controlling the pH value to 9 or more at the above composition, by adding the pH adjusting agent to the processing solution tank from the pH adjusting agent tank when the pH value of the processing solution in the processing solution tank is less than 9, fluctuation of the composition of the processing solution due to precipitation is prevented and therefore the lifetime of the processing solution can be extended. Furthermore, the amount of waste of the processing solution and therefore the consumption of the processing solution can be reduced.

In addition, to achieve the above object, according to a fourth aspect of the present invention, there is provided an electroless plating apparatus for processing a plating surface to form a barrier layer comprising a means for feeding to the plating surface a processing solution at least including, with respect to one mole of a first metallic material supplying a main ingredient of the barrier layer, three or more moles of a complexing agent and three or more moles of a reducing agent, and a pH adjusting agent and having a pH value adjusted in a region from neutral to alkali.

In the above electroless plating apparatus of the present invention, preferably an electroless plating bath filled with the processing solution is provided as the plating solution feeding means, and the plating object having the plating surface is immersed in the electroless plating bath for electroless plating.

More preferably, the above electroless plating apparatus further comprises a lid provided on the electroless plating bath and a means for feeding a gas including at least an inert gas or ammonia gas to the electroless plating bath sealed by the lid.

Alternatively, preferably the above electroless plating apparatus comprises a plating cell arranged to allow its inside surface to be seen by the plating surface and separating at least the plating surface from the outside atmosphere and a means for feeding a gas including at least an inert gas or ammonia gas to the plating cell, wherein a plating solution is fed to the plating surface seen from the inside surface of the plating cell by the plating solution feeding means.

In the above electroless plating apparatus, preferably a processing solution of a pH value adjusted to 9 or more is fed by the plating solution feeding means as the processing solution.

More preferably, the above electroless plating apparatus further comprises a processing solution tank for storing the processing solution, a measuring means for measuring the pH value of the processing solution in the processing solution tank, a pH adjusting agent tank for storing the pH adjusting agent, and a control means for adding the pH adjusting agent from the pH adjusting agent tank to the processing solution tank to increase the pH value to 9 or more when the pH value of the processing solution in the processing solution tank is less than 9.

In the above electroless plating apparatus, preferably, as the processing solution, a processing solution further including a second metallic material supplying an ingredient enhancing the barrier ability of the barrier layer is fed.

In addition, preferably, a processing solution containing a complexing agent including a first completing agent of an amphoteric ion type and a second completing agent for enhancing a plating reaction is fed.

In addition, preferably, a processing solution containing a first metallic material including at least a compound of nickel or cobalt is fed.

In addition, preferably, a processing solution containing a second metallic material including at least a compound of tungsten or molybdenum is fed.

In addition, preferably, a processing solution containing 0.2% to 2% of the tungsten or molybdenum by atomic weight concentration is fed.

In addition, preferably, a processing solution containing an amino acid as the first completing agent is fed.

In addition, preferably, a processing solution containing an organic acid as the second complexing agent is fed.

In addition, preferably, a processing solution in which the complexing agent, the reducing agent, and the pH adjusting agent substantially do not contain a metal in their chemical formulae is fed.

In addition, preferably, the above electroless plating apparatus further comprises a heater for adjusting the temperature of the processing solution to 50° C. to 95° C.

In the above electroless plating apparatus, by adjusting the molar ratio in the processing solution for the electroless plating to three or more moles of complexing agent and three or more moles of reducing agent to one mole of the first metallic material, a film is able to be formed stably and uniformly by electroless plating. Furthermore, with the pH value not less than 9, a dense and high quality plating film giving a lustrous surface can be formed.

In addition, by controlling of the pH value to 9 or more at the above composition, using an electroless plating bath closed by a lid and a plating cell arranged so that its inside surface is seen by the plating surface and separating the plating surface from the outside atmosphere, storing the processing solution in an atmosphere of nitrogen gas or an other inert gas or ammonia gas, and feeding it to the plating surface in a pressurized atmosphere of an inert gas or ammonia gas, the fluctuation of the composition of the processing solution due to precipitation is prevented, the lifetime of the processing solution can be increased, and the waste of the processing solution and therefore the consumption of the processing solution can be reduced.

BRIEF DESCRIPTION OF THE DRAWINGS

The above and other objects and features of the present invention will be more apparent from the following description of the preferred embodiments given with reference to the accompanying drawings, wherein:

FIG. 2A shows the step of forming first interconnections; FIG. 2B shows the step of forming a first etching stopper film; while FIG. 2C shows the step of forming a pattern opening in the first etching stopper film;

FIG. 3A shows the step of forming a second etching stopper film, while FIG. 3B shows the step of forming interconnection grooves and an opening for a contact hole;

FIG. 4A shows the step of forming a barrier metal layer, while FIG. 4B shows the step of depositing a conductive film (copper);

FIG. 5A shows the step of feeding a processing solution, FIG. 5B shows the step of puddling, and FIG. 5C shows the step of removing the processing solution by spinning;

DESCRIPTION OF THE PREFERRED EMBODIMENTS

Below, an explanation will be given, with reference to the accompanying drawings, of methods of electroless plating and electroless plating apparatuses according to embodiments of the present invention as applied to a method for forming a conductive film.

First Embodiment

Figure 1:
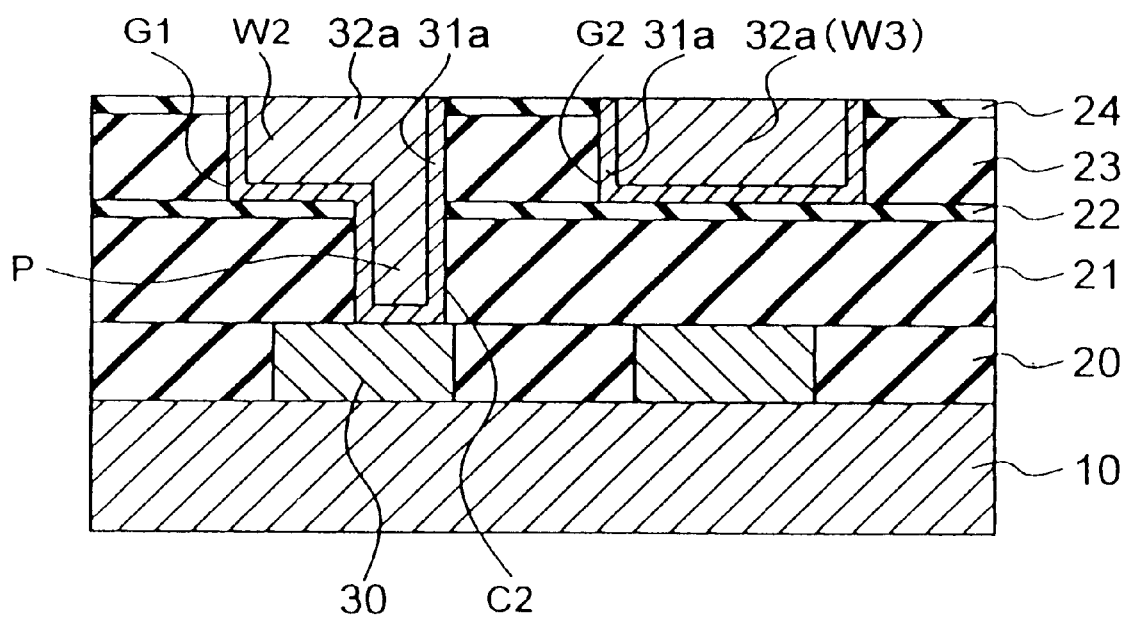
FIG. 1 is a sectional view of a semiconductor device to which the electroless plating apparatus and method of the present invention are applied.

FIG. 1 is a sectional view of a semiconductor device with a conductive film formed by using a method of electroless plating and an electroless plating apparatus according to a first embodiment of the present embodiment.

A first insulating film 20 comprised of for example silicon oxide is formed on a substrate 10 on which MOS transistors and other semiconductor elements are formed. Openings reaching the semiconductor substrate 10 are formed, then first interconnections 30 comprised of conductive material of copper, polycrystalline silicon, tungsten, etc. are formed through them.

Above the first insulating film 20 and the first interconnections 30 are formed for example a second insulating film 21 comprised of silicon oxide, a first etching stopper 22 comprised of silicon nitride, a third insulating film 23 comprised of silicon oxide, and a second etching stopper 24 comprised of silicon nitride.

The above third insulating film 23 and the second etching stopper 24 are formed with interconnection grooves (G1, G2). Further, a contact hole C2, which penetrates the second insulating film 21 and the first etching stopper 22 and exposes the upper surface of a first interconnection 30, is formed in communication with the aforesaid interconnection groove G1.

The inside walls of the communicating contact hole C2 and interconnection groove G1 and the inside walls of the interconnection G2 are covered by a barrier metal film 31a comprised of for example CoWP (alloy of cobalt and tungsten containing phosphorous). A conductive film 32a comprised of for example copper is formed to bury the insides of the holes and grooves via the barrier metal film 31a. Therefore, a contact plug P and a second interconnection. W2 are formed in the contact hole C2 and interconnection groove G1 and a third interconnection W3 is formed in the interconnection groove G2.

In the above structure, the second interconnection W2 is connected with the underlying interconnection, that is, the first interconnection 30, through the contact plug P.

Below, the method for forming a conductive film will be explained with reference to the figures.

Figure 2A:
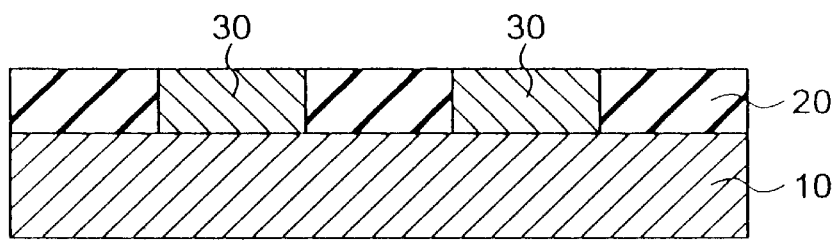
FIGS. 2A to 2C are sectional views illustrating steps of forming a conductive film in the semiconductor device shown in FIG. 1, where

First, as shown in FIG. 2A, silicon oxide is deposited by for example CVD on a semiconductor substrate 10 formed with not illustrated MOS transistors and other semiconductor elements to form a first insulating film 20.

Next, openings reaching the semiconductor substrate 10 are formed in the first insulating film 20, and the openings is buried with copper, polycrystalline silicon, tungsten, or another conductive material to form the first interconnections 30.

Figure 2B:
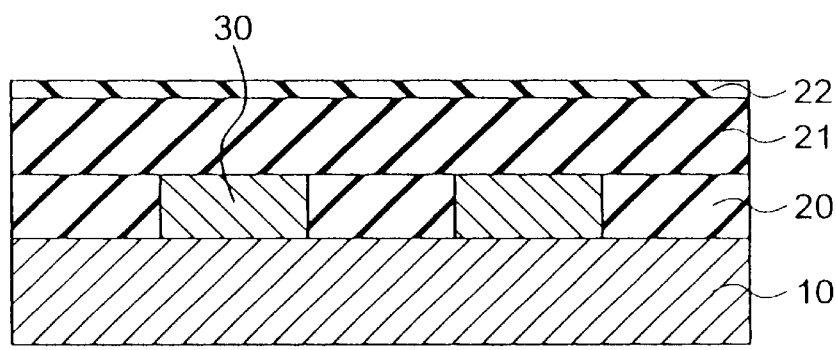

Next, as shown in FIG. 2B, silicon oxide is deposited on the first insulating film 20 and the first interconnections 30 by CVD to form a second insulating film 21. Further, silicon nitride is deposited on the second insulating film 21 for example still by CVD to form a first etching stopper 22.

Figure 2C:
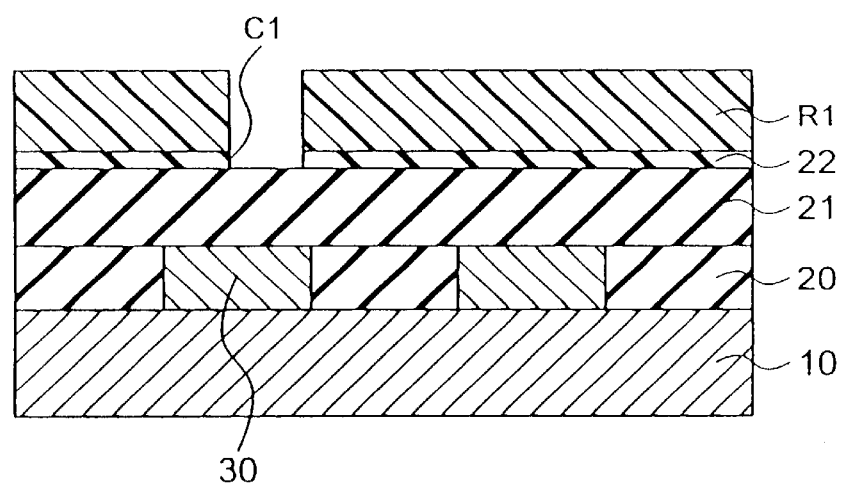

Next, as shown in FIG. 2C, using photolithography, a resist film RI is formed above the first etching stopper 22 and patterned to form an opening of the pattern of the contact hole, then the first etching stopper 22 is etched by reactive ion etching (RIE) or other etching using the resist film R1 as a mask to form the pattern opening C1 exposing the upper surface of the first insulating film 21.

Figure 3A:
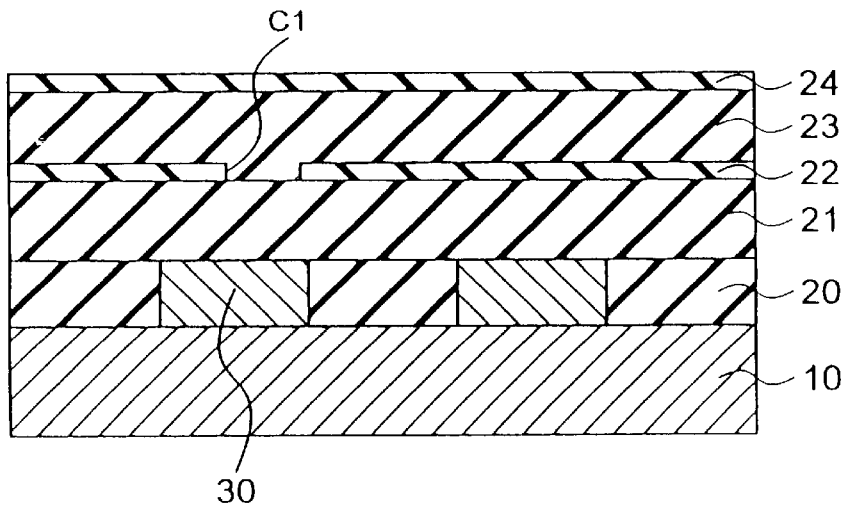
FIGS. 3A and 3B are sectional views illustrating steps continuing from FIGS. 2A to 2C, where

Next, as shown in FIG. 3A, silicon oxide is deposited in the pattern opening C1 and on the first etching stopper 22 by for example CVD to form a third insulating film 23. Silicon nitride is further deposited on this by CVD to form a second etching stopper 24.

Figure 3B:
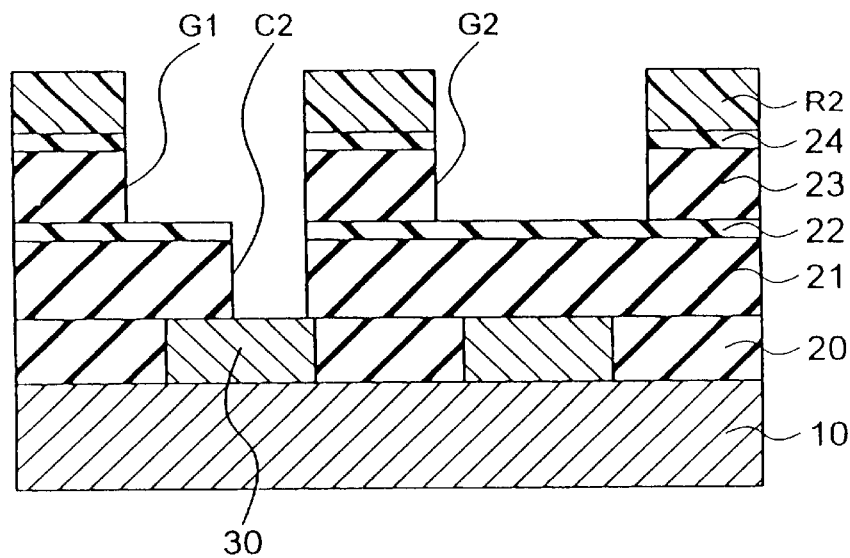

Next, as shown in FIG. 3B, using for example photolithography, a resist film R2 is formed above the second etching stopper 24 and patterned to make openings of the pattern of interconnections.

Next, the second etching stopper 24 is etched by RIE or other etching to pattern it using the resist film R2 as a mask. Next, the third insulating film 23 is selectively etched and removed from the first etching stopper 22 by RIE or other etching to form interconnection grooves (G1, G2) in the third insulating film 23 and the second etching stopper 24. By arranging the pattern opening C1 formed in the above first etching stopper 22 in the region of the interconnections (G1, G2) f1 at this time, the first insulating film 21 in the region of the pattern opening C1 is also etched away using the first etching stopper 22 as a mask, whereby a contact hole C2 exposing the upper surface of the first interconnection 30 is formed in communication with the interconnection groove G1.

Figure 4A:
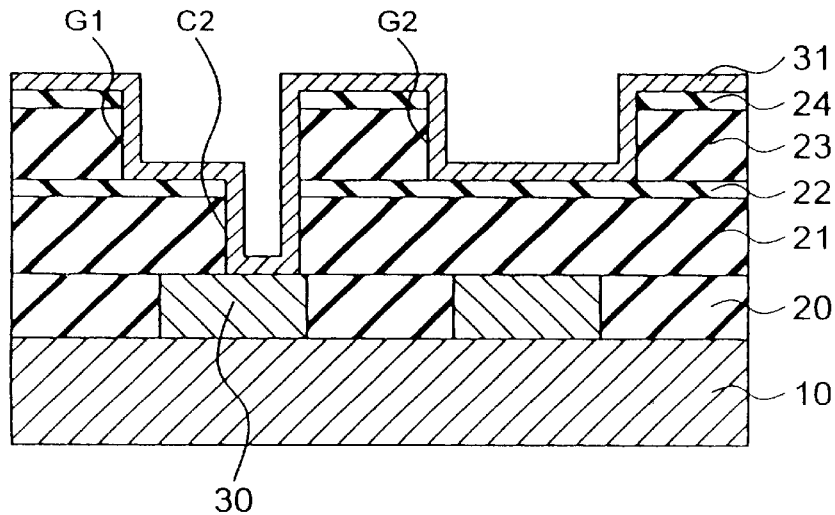
FIGS. 4A and 4B are sectional views illustrating steps continuing from FIGS. 3A and 3B, where

Next, as shown in FIG. 4A, a barrier metal film 31a comprised of for example CoWP (alloy of cobalt and tungsten containing phosphorous) is formed by electroless plating to cover the entire inside walls of the contact hole C2 and the interconnection grooves (G1, G2).

In forming the above barrier metal film 31, as pre-processing for the electroless plating, it is necessary to apply activate (catalyze) the plating surface (the surface of the silicon oxide insulating film and the surface of the copper conductive film, polycrystalline silicon, tungsten, etc.) using palladium or another highly catalytic metal. For example, the surface may be activated (catalyzed) by the steps illustrated below:

(1) Removal of Organic Contaminants

First, organic contaminants on the plating surface are removed by means of treatment by ultraviolet rays/ozone, plasma ashing, or treatment by ozonized water.

(2) Hydrophilization

Next, by the plating surface is oxidized in water to introduce hydroxyl groups (—OH groups) to the surface to make the plating surface hydrophilic. The methods for this include treatment using ozonized water, treatment by sulfuric acid and hydrogen peroxide, treatment by hypochlorous acid, treatment by ammonia and hydrogen peroxide, treatment by ammonium permanganate, etc.

(3) Silane (Titanium) Coupling

Next, a silane coupling agent or a titanium coupling agent or other coupling agent may be used to cause a reaction between the above hydroxyl groups and coupling agent and form covalent bonds so as to form coordinate bonds with the palladium colloid of the next step to raise the bonding force between the two.

(4) Catalyzation

Next, tin chloride-protected palladium colloid or another catalytic metal is used to form coordinate bonds between the tin atoms of the tin chloride and the coupling agent and bond the catalytic metal to the plating surface. As the colloid, use can be made of for example Catalyst 9F of SHIPLEY (phonic) Corporation or Enplate Activator 444 of Enthone-OMI Corporation.

(5) Activation

Next, the tin chloride is stripped from the for example tin chloride-protected palladium colloid to expose the palladium (catalytic metal) for the activation. For example, Accelerator 19 or Accelerator 240 of SHIPLEY (phonic) Corporation can be used for this activation.

A step of rinsing with pure water may be interposed between each two of these above steps.

Note that the step (1) for removing organic contaminants and step (2) for hydrophilization are not necessarily required and may be performed only when needed.

After activating the plating surface in the above way, the semiconductor substrate 10 is electrolessly plated, whereby metal is reduced on the exposed palladium and a barrier metal layer 31 of a uniform thickness is formed on the entire plating surface.

The electroless plating method and the electroless plating apparatus of the present invention are used in the above activation of the plating surface and electroless plating for forming the barrier metal layer 31.

Figure 5A:
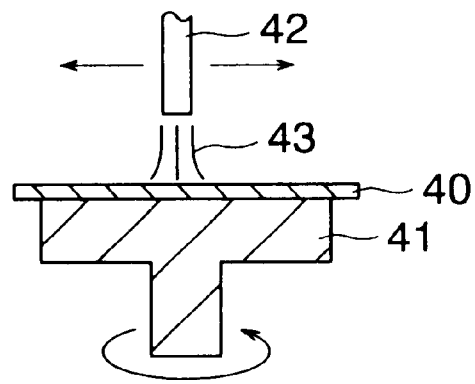
FIGS. 5A to 5C are schematic sectional views showing the process of puddling treatment according to the present invention, where
Figure 5B:
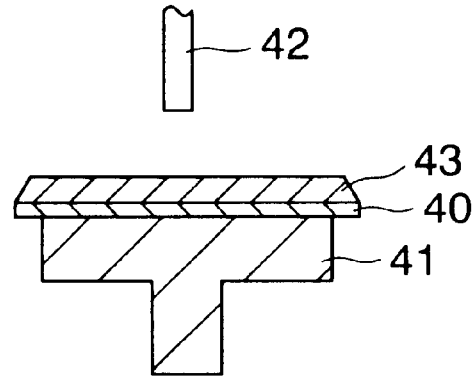
Figure 5C:
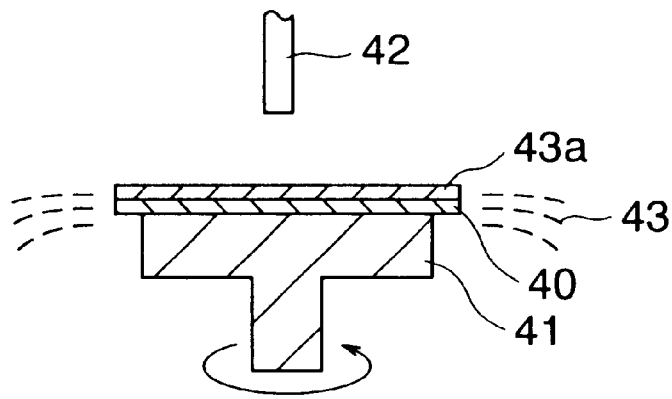

Namely, as shown in FIGS. 5A to 5C, puddling treatment is used for the processing solution used in at least one of the hydrophilization, coupling, catalyzation, and activation steps performed as the pre-processing for the electroless plating for forming the above barrier metal layer or used in electroless plating of the process for forming the barrier metal layer.

Preferably puddling treatment is used for all of the above processing solutions.

In puddling treatment, first, as shown in FIG. 5A, a wafer 40 to be processed is placed on a usual turntable 41 used in spin-coating and is fixed in place by a not shown electrostatic chuck or other means. The processing solution 43 is dropped from a nozzle 42 onto the processed wafer 40 while the turntable 41 is rotating and spreads over the entire surface of the processed wafer 40.

The nozzle 42 may be swung from the inner side to the outer side of the turntable 41 or vice versa while the turntable 41 is rotating.

If the processing solution 43 can spread over the entire surface of the wafer 40 otherwise, the turntable 41 does not necessarily have to be rotated.

In addition, the nozzle 42 may be a spray nozzle which sprays the processing solution 43.

Next, as shown in FIG. 5B, the turntable 41 is stopped after the processing solution 43 spreads over the entire surface of the processed wafer 40, then puddling treatment is performed for a predetermined time of for example 1 to 2 minutes.

After the predetermined time elapses in the above puddling state, as shown in FIG. 5C, the turntable 41 is rotated to spin off the processing solution 43 by centrifugation.

The surface of the wafer 40 can therefore be processed by the processing solution 43 for a predetermined time in this way.

Due to this puddling treatment, for example, in the case of electroless plating, a plating film 43a is formed on the processed wafer 40. Even with only one puddling treatment, a greater effect of deposition can be obtained than with coating using a conventional spin-coater, by repeating the above steps of FIGS. 5A to 5C, it is possible to thickly form the plating film 43a to form a plating film 43a of the desired thickness and thereby form a barrier metal film of a predetermined thickness.

It is also possible to perform puddling treatment repeatedly two times or more to realize a predetermined time of treatment for the catalyzation and other steps.

For example, when Using puddling treatment for catalyzation and electroless plating for an eight-inch wafer, if each step shown in FIG. 5A to FIG. 5C is repeated twice, since the amount of processing solution used in each puddling treatment is approximately 50 ml, a total of 100 ml of the processing solution is used in two treatments.

On the other hand, when performing the same treatment by spin-coating, if the discharge from the nozzle is 10 ml/sec and treatment is performed for one minute, approximately 600 ml of the processing solution is required.

Therefore, due to the puddling treatment, the consumption of the processing solution can be reduced to approximately one-sixth that of the spin-coating method.

The processing solution used for the electroless plating includes a first metallic material for supplying cobalt, nickel, or another main ingredient of the conductive film serving as the barrier metal layer; a first complexing agent of an amphoteric ion type (first chelating agent); a second complexing agent for promoting a plating reaction (second chelating agent); a reducing agent; and a pH adjuster and, if necessary, further includes a second metallic material containing tungsten, molybdenum, etc. for raising the barrier ability of the barrier metal layer.

For the first metallic material, use can be made of for example nickel chloride, nickel sulfate, cobalt chloride, cobalt sulfate, or other compounds containing nickel or cobalt in a concentration of for example 10 to 100 g/l.

For the second metallic material added when necessary, use can be made of for example ammonium tungstate, ammonium molybtate, or other compounds containing tungsten or molybdenum in a concentration of for example 3 to 30 g/l.

For the first complexing agent of an amphoteric ion type, use can be made of glycine, alanine, valine, leucine, isoleucine, methionine, phenylalanine, proline, tryptophan, serine, threonine, tyrosine, asparagine, glutamine, cysteine, glutamic acid, aspartic acid, lycine, histidine, arginine, or other amino acids at a concentration of for example 2 to 50 g/l.

For the second complexing agent for promoting a plating reaction, use can be made of for example ammonium succinate, ammonium malate, ammonium citrate, ammonium malonate, ammonium formate, or other organic acid compounds (ammonium salts) at a concentration of for example 2 to 50 g/l.

For the reducing agent, use can be made of for example ammonium hypophosphite, formalin, glyoxalic acid, hydrazine, ammonium borohydroxide, etc. at a concentration of for example 2 to 200 g/l.

For the pH adjusting agent, preferably use can be made of ammonia water or tetramethylammonium hydroxide (TMAH). The amount of the pH adjusting agent added into the electroless plating processing solution can be suitably adjusted in the range from 5 to 500 ml/l so that the pH value of the processing solution becomes for example in the range from neutral to alkaline (for example, pH=7 to 12 or, when tungsten or molybdenum is present, and 8 to 12).

It is preferable that the first and second complexing agents, the reducing agent, and the pH adjusting agent included in the above electroless plating processing solution substantially do not contain metals in their chemical formulae.

If sodium salts or other compounds containing metals are included, this kind of solution is not applicable to semiconductors since the semiconductors will be contaminated by the sodium or other metals.

It is preferable that the temperature of the above electroless plating processing solution be adjusted to 50° C. to 95° C.

Below 50° C., the reaction speed of the electroless plating is slow and therefore the reaction is impractical, while above 95° C., the effects of the volatilization of ammonia and boiling of the processing solution begin to appear and the stability of the processing solution undesirably declines.

The conductive film serving as the barrier metal film formed in this way comprises a film of the metal supplied from the first metallic material contained in the electroless plating processing solution. When a second metallic material enhancing the barrier ability of the conductive film is included in the processing solution, the conductive film comprises an alloy of the metals supplied from the first and second metallic materials.

For example, when a compound containing cobalt or nickel is used for the first metallic material, a cobalt or nickel film can be formed. When ammonium hypophosphite is used as the reducing agent in the electroless plating processing solution, since phosphorous is also incorporated in the alloy film, more precisely a CoP film (cobalt film containing phosphorous) is formed as the above cobalt film. The same is true for a nickel film.

When a compound containing nickel or cobalt is used for the first metallic material and a compound containing tungsten or molybdenum is used for the second metallic material, a CoW (alloy of cobalt and tungsten) film, a NiW (alloy of nickel and tungsten) film, a CoMo (alloy of cobalt and molybdenum) film, or a NiMo (alloy of nickel and molybdenum) film can be formed.

When ammonium hypophosphite is used for the reducing agent in the electroless plating bath, in the same way as the above, precisely a CoWP (alloy of cobalt and tungsten containing phosphorous) film is formed as the CoW film. Phosphorous is also incorporated into the other alloy films in the same way.

In order to raise the barrier ability of the conductive film formed by the above electroless plating, it is preferable that at least 1% atomic weight of tungsten or molybdenum be included in the conductive film. To realize this, it is preferable to add 0.2% to 2% atomic weight of tungsten or molybdenum to the electroless plating processing solution.

Because adding a reducing agent to a metal chelating agent in the electroless plating solution causes a reduction reaction and therefore a shorter lifetime of the electroless plating solution, it is preferable to prepare and store the processing solution divided into two or three or more systems beforehand, for example, a solution including metal salts forming the barrier metal layer and a chelating agent, a solution including the reducing agent, and so on, and to mix them for use immediately before the electroless plating process.

For example, it is possible to divide an electroless plating processing solution for forming a CoP film into two systems of a cobalt chelating solution with a pH value adjusted to 7 to 12 (containing cobalt chloride and glycine, ammonium succinate, or another complexing agent) and a reducing solution with a pH value adjusted to 7 to 12 (containing ammonium hypophosphite or the like), adjust the processing solutions in temperature to 50° C. to 95° C., and mix them immediately before the electroless plating process.

Further, for example, it is possible to divide an electroless plating processing solution for forming a CoWP film into three systems of a cobalt chelating solution with a pH value adjusted to 8 to 12 (containing cobalt chloride and glycine, ammonium succinate, or another complexing agent), an ammonium tungstate or ammonium molybdate solution with a pH value adjusted to 8 to 12, and a reducing solution with a pH value adjusted to 8 to 12 (containing ammonium hypophosphite), adjust the processing solutions in temperature to 50° C. to 95° C., and mix them immediately before the electroless plating process.

Further, for example, it is possible to divide an electroless plating processing solution for forming a CoWP film into two systems of a cobalt chelating solution with a pH value adjusted to 8 to 12 (containing cobalt chloride and glycine, ammonium succinate, or another complexing agent) and a reducing solution with a pH value adjusted to 8 to 12 (containing ammonium hypophosphite, ammonium tungstate, or ammonium molybdate), adjust the processing solutions in temperature to 50° C. to 95° C., and mix them immediately before the electroless plating process.

When dividing the electroless plating processing solution into two or three or more systems as shown above, it is necessary to adjust in advance the pH value of each system using ammonia, TMAH, etc. so as to give the predetermined pH value (pH=7 to 12 or, when tungsten or molybdenum is present, 8 to 12) required after the systems of processing solutions are mixed. Since the pH value changes due to chemical reactions in a solution, it is preferable to adjust the pH value of each system of processing solution before mixing to give required pH value after mixing.

Particularly, an electroless plating processing solution for forming a CoWP film should have a pH value not less than 8 after mixing. Preferably the pH values of the systems of the solutions are adjusted to 8 or more before mixing. This is because 2 moles or more ammonium for 1 mole of tungstic acid are required to keep ammonium tungstate in the solution state. If the ammonia volatilizes and the pH value falls below 8, the tungstic acid will crystallize. The same is true for ammonium molybdate.

When dividing the electroless plating processing solution into two or three or more systems as shown above, the apparatus may be configured to feed the different systems of the electroless plating processing solution from their respective tanks by pressurizing the gas in the tanks or by pumps connected to the tanks.

When pressurizing the gas in the tanks, it is preferable to use nitrogen gas or another inert gas or ammonia gas. Even if not pressurizing the gas, it is still preferable to purge the inside of the tank by using nitrogen gas or another inert gas or using ammonia gas.

Due to this, oxidization of the processing solution caused by the oxygen in the air can be prevented. Especially, in the case of a processing solution including a cobalt chelating agent, the precipitation of $Co(OH)_2$ can be prevented. In addition, the volatilization of the ammonium tungstate or the ammonian ingredient added as ammonia water for adjusting the pH value can be prevented, and therefore a decline of the pH value can be prevented.

When using ammonia gas as the ambient gas in a tank, if the ammonia gas is pressurized too high, the ammonia will dissolve into the processing solution and the pH value may change. Therefore, it is also possible to make the ambient gas a mixture of ammonia gas and an inert gas and adjust the partial pressure of the ammonia gas to an extent preventing the volatilization of the ammonian ingredient.

When dividing the electroless plating processing solution into two or three or more systems, these systems of solutions can be mixed and applied (including spraying), for example, by using the apparatuses illustrated in FIG. 6 to FIG. 11.

Figure 6:
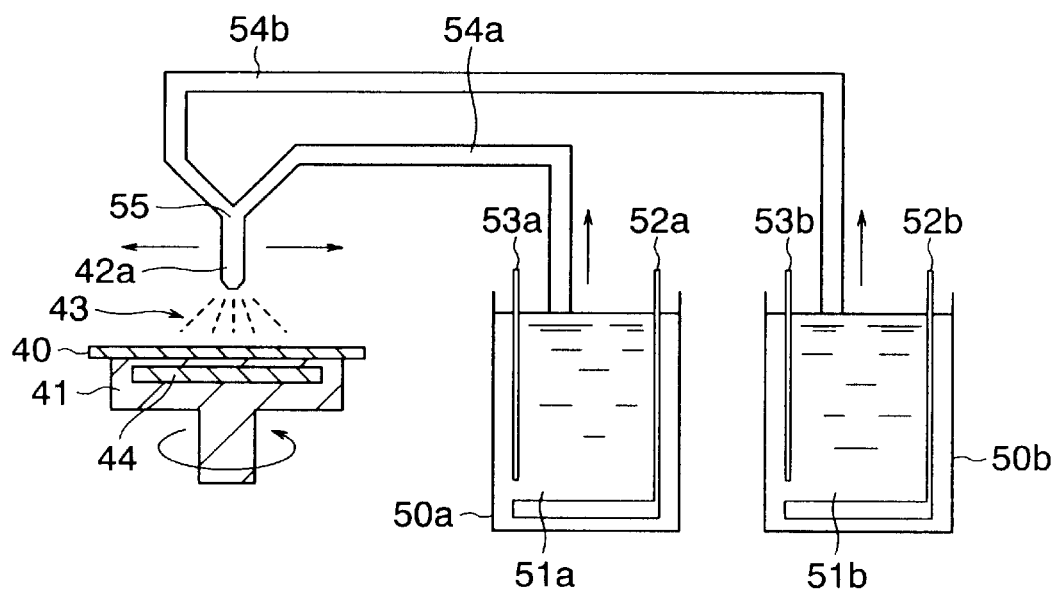
FIG. 6 is a schematic view of a configuration of a spin-coater able to divide an electroless plating solution into two parts for preparation and storage according to the present invention.

FIG. 6 is a view of an apparatus having two tanks for mixing and applying the systems of electroless plating solutions when dividing the electroless plating solution into two systems.

The first tank 50a contains, for example, a cobalt chelating solution (containing cobalt chloride and glycine, ammonium succinate, or another complexing agent) 51a. The cobalt chelating solution 51a is kept heated by a heater 52a, for example, in a pressurized atmosphere of nitrogen gas while being stirred as necessary by a not shown stirring means. The temperature of the cobalt chelating solution 51a is monitored by a temperature sensor 53a. According to the monitored result, the heater 52a is controlled by a control circuit so that the cobalt chelating solution 51a is maintained at a predetermined temperature.

On the other hand, the second tank 50b contains, for example, a reducing solution (containing ammonium hypophosphite, ammonium tungstate, ammonium molybdate, etc.) 51b. The reducing solution 51b similarly is heated by a heater 52b n a pressurized atmosphere of nitrogen gas while being stirred when necessary by a not shown stirring means. The temperature of the reducing solution 51b is monitored by a temperature sensor 53b. According to the monitored result, the heater 52b is controlled by a control circuit so that the reducing solution 51b is maintained at a predetermined temperature.

A first pipe 54a is connected with the first tank 50a. The cobalt chelating solution 51a is discharged into the first pipe 54a by the pressurized ambient gas in the first tank 50a. On the other hand, a second pipe 54b is connected with the second tank 50b. The reducing solution 51b is discharged into the second pipe 54b by the pressurized ambient gas in the first tank 50b.

The cobalt chelating solution 51a and the reducing solution 51b are merged and mixed in a merging portion 55 immediately before a spray nozzle 42a. Therefrom the mixed processing solution 43 is sprayed onto the processing surface of the wafer 40 fixed on the turntable 41. That is, when the cobalt chelating solution 51a and the reducing solution 51b are spayed from the spray nozzle 42a, they are sufficiently mixed.

To ensure the processing solution 43 is spread over the entire processed wafer 40, when the turntable is rotating, the spray nozzle 42 may be swung from the inner side to the outer side of the turntable 41 or vice versa.

The cobalt chelating solution 51a and the reducing solution 51b are heated in their tanks (50a, 50b) to maintain the obtained processing solution 43 at the predetermined temperature. In order to prevent a drop of the temperature of the processing solution 43, the pipes from tanks to the spray nozzle 42a may be made heatable. Further, a heater 44 may also be buried in the turntable 41 to heat from the side of the processed wafer 40.

After ensuring the processing solution 43 is spread over the entire processed wafer 40, the turntable 41 is stopped for a predetermined time period for the puddling treatment. Then, the turntable 41 is rotated to spin off the processing solution 43 by centrifugal force.

When necessary, the above puddling treatment can be repeated twice or more for treatment for a predetermined time.

Figure 7:
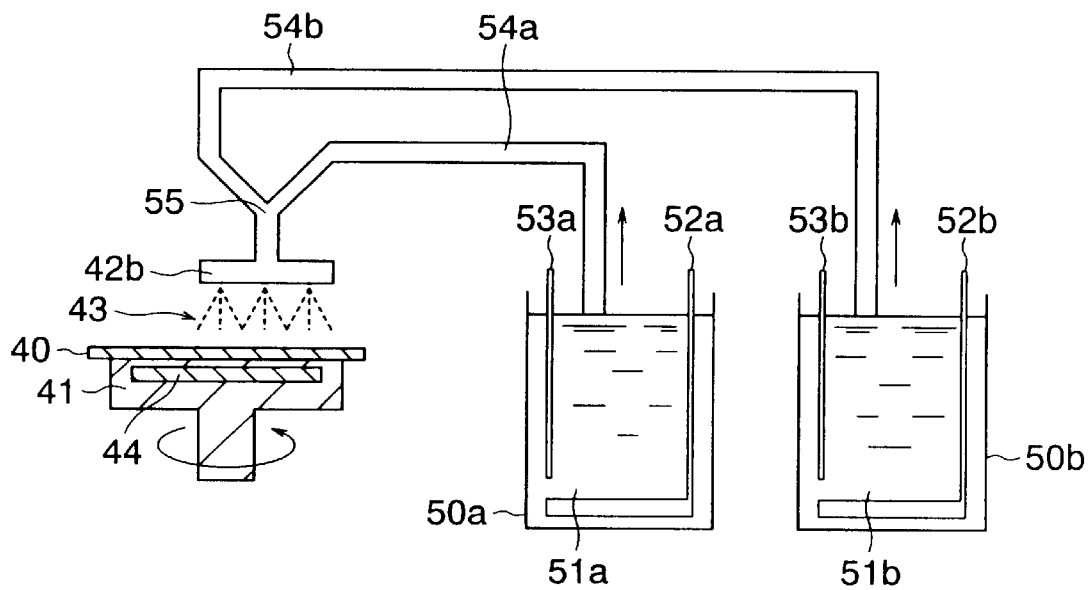
FIG. 7 is a schematic view of another configuration of a spin-coater able to divide an electroless plating solution into two parts for preparation and storage according to the present invention.

FIG. 7 is a view of an apparatus having two tanks for mixing and applying the systems of electroless plating solutions when dividing the electroless plating solution into two systems. This apparatus is substantially the same as that in FIG. 6, except that the spray nozzle 42b here is formed into a T-shape at the front end of the merging portion 55, and is provided with a number of spray holes.

With this configuration, the processing solution 43 can be made to spread over the entire processed wafer 40 even without making the spray nozzle 42b swing.

Figure 8:
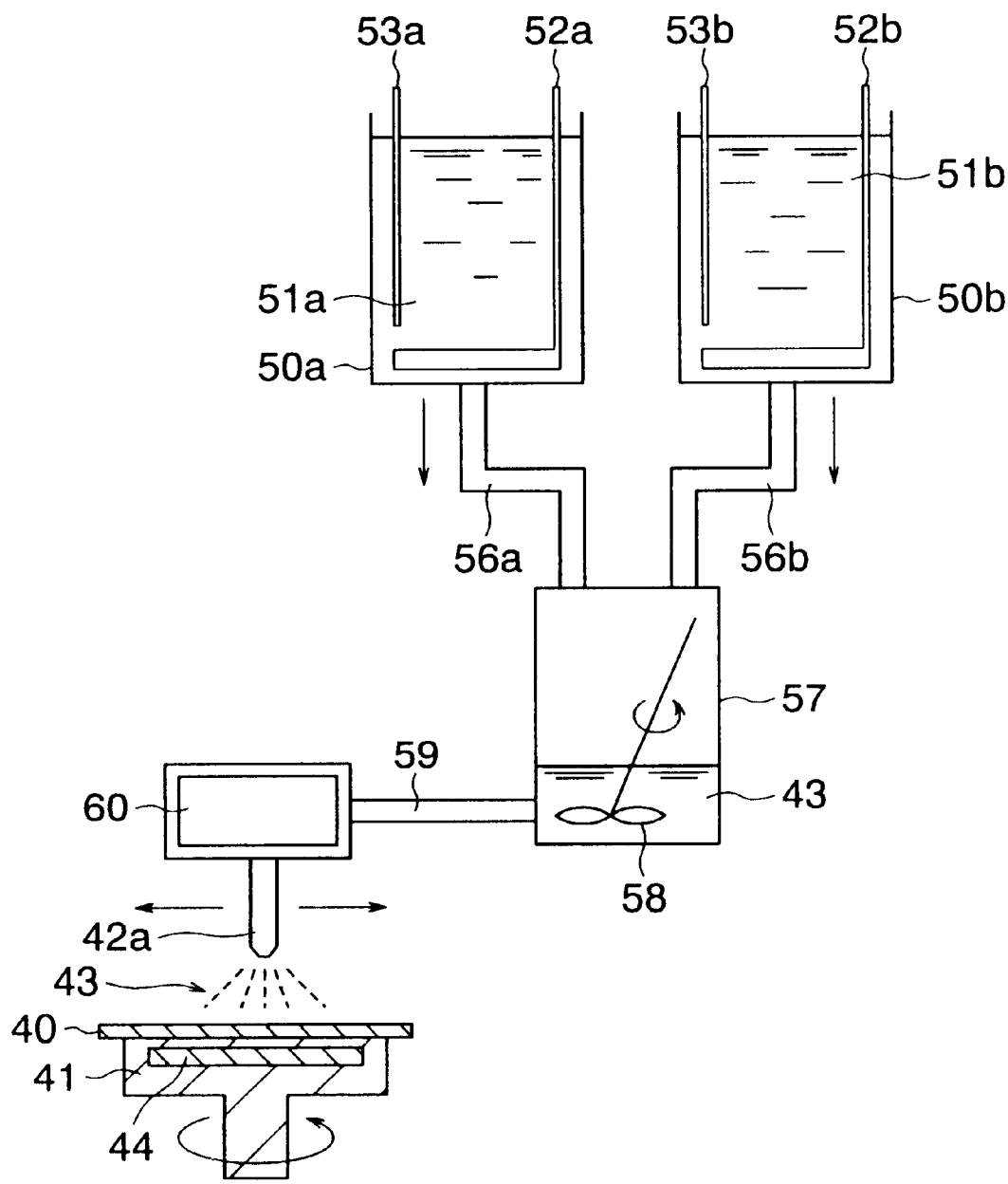
FIG. 8 is a schematic view of still another configuration of a spin-coater able to divide an electroless plating solution into two parts for preparation and storage according to the present invention.

FIG. 8 is a view of an apparatus having two tanks for mixing and applying the systems of electroless plating solutions when dividing the electroless plating solution into two systems. This apparatus is substantially the same as that of FIG. 6, except that the cobalt chelating solution 51a and the reducing solution 51b from the first and second tanks 50a and 50b flow through the pipes 56a and 56b and are collected in a mixing tank 57 where they are stirred and mixed by a mixer 58 and that the resultant processing solution 43 is further pumped by a pump 60 via a pipe 59 and sprayed from the spray nozzle 42a.

In this configuration, it is preferable to use a nitrogen ambient gas in the mixing tank 57 in order to prevent deterioration of the processing solution 43 therein. In addition, the time for mixing should be short enough so that essential no reactions occur in the processing solution 43.

With this configuration, the cobalt chelating solution 51a and the reducing solution 51b can be sufficiently mixed. Therefore, the processing solution 43 can be dropped on the processed wafer 40 using just a normal nozzle and not a spray nozzle.

In this configuration, to make the processing solution 43 spread over the entire processed wafer 40, if the turntable is rotating, the spray nozzle (or regular nozzle) 42a may also be swung from the inner side to the outer side of the turntable 41 or vice versa.

Figure 9:
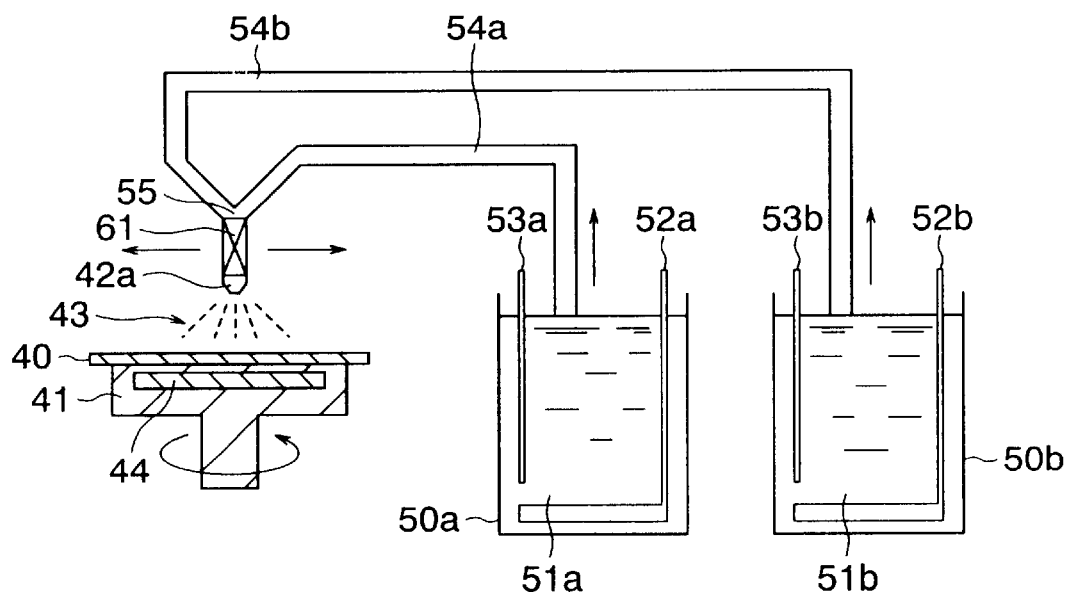
FIG. 9 is a schematic view of still another configuration of a spin-coater able to divide an electroless plating solution into two parts for preparation and storage according to the present invention.

FIG. 9 is a view of an apparatus having two tanks for mixing and applying the systems of electroless plating solutions when dividing the electroless plating solution into two systems. This apparatus is substantially the same as that of FIG. 6, except a static mixer 61 is provided between the merging portion 55 and the spray nozzle 42a to sufficiently mix the cobalt chelating solution 51a and the reducing solution 51b.

A "static mixer" consists of two types of spiral elements obtained by twisting short metal plates by 180 degrees. These elements are alternately fixed in a mixer tube offset by 90 degrees from each other. This unit does not use rotating blades or a motor and is capable of simply and sufficiently mixing two types of solutions.

In this case, the processing solution 43 can also be dropped onto the processed wafer 40 with a normal nozzle and not a spray nozzle.

Figure 10:
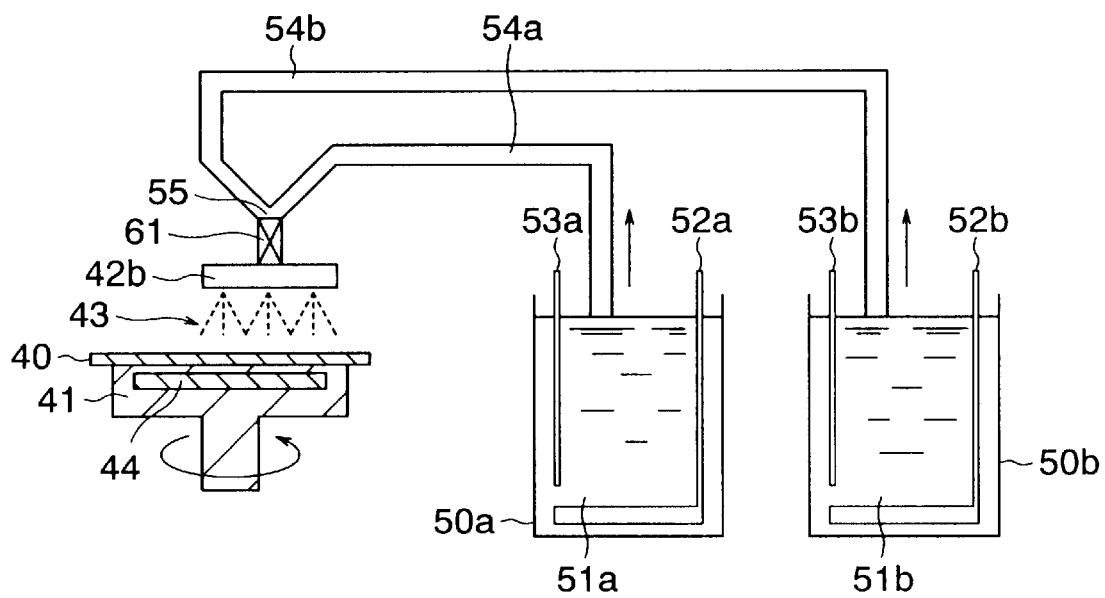
FIG. 10 is a schematic view of still another configuration of a spin-coater able to divide an electroless plating solution into two parts for preparation and storage according to the present invention.

FIG. 10 is a view of an apparatus having two tanks for mixing and applying the systems of electroless plating solutions when dividing the electroless plating solution into two systems. This apparatus is substantially the same as that of FIG. 7, except that a static mixer 61 is provided between the merging portion 55 and the spray nozzle 42a to sufficiently mix the cobalt chelating solution 51a and the reducing solution 51b.

The above apparatuses in FIG. 6 to FIG. 10 are shown for the case of division of an electroless plating solution into two systems, but it is possible to handle division into three or more systems by installing additional tanks and pipes.

Figure 11A:
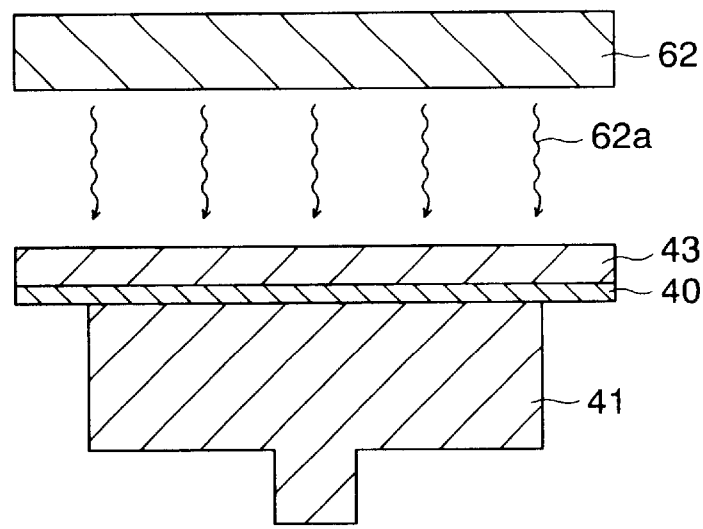
FIGS. 11A and 11B are schematic sectional views of the configuration of a heater for heating a processing solution puddled on a plating surface according to the present invention.

In the above apparatuses in FIG. 6 to FIG. 10, the solutions before mixing are heated in their tanks to a predetermined temperature. In order to prevent a decline of the temperature of the processing solution 43, as shown in FIG. 11A, the processing solution 43 can be irradiated and heated to a predetermined temperature by infrared rays 62a emitted from an IR (infrared) heater 62 in addition to heating methods of using heatable pipes from the tanks to the spray nozzle 42a and of burying a heater 44 in the turntable 41 to heat from the side of the processed wafer 40. The distance between the surface of the IR heater 62 and the puddled processed solution 43 is not particularly limited.

Figure 11B:
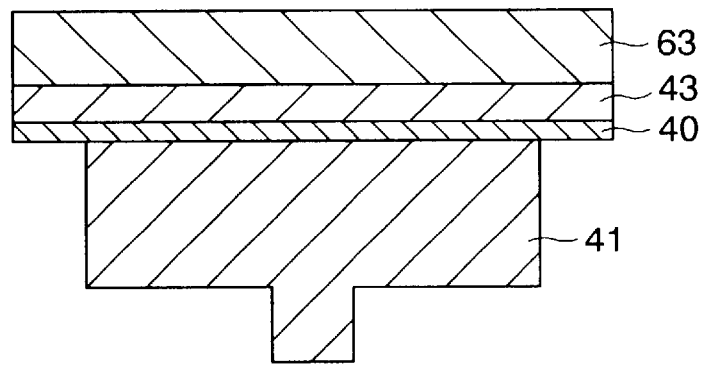

In addition, as shown in FIG. 11B, the processing solution 43 can also be heated to a predetermined temperature by bringing a panel heater 63 into contact the processing solution 43 so that the solution 43 is sandwiched between the processed wafer 40 and the panel heater 63.

The above heating methods can also be combined to more efficiently control the temperature of the processing solution.

Figure 4B:
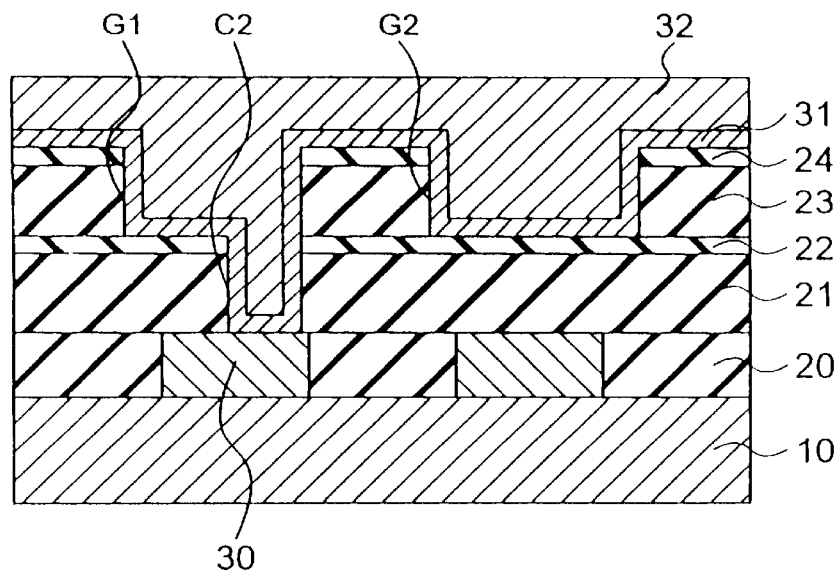

After forming a barrier metal layer on the plating surface of the semiconductor substrate 10 in the above way, as shown in FIG. 4B, a conductive film 32 is formed by depositing for example copper on the barrier metal layer 31 to completely bury the contact hole C2 and interconnection grooves G1 and G2 by an electroplating treatment that uses a barrier metal layer comprising for example an alloy of cobalt and tungsten as a seed film (a layer covering the cathode in electroplating).

In the above electroplating treatment for depositing copper, a common copper sulfate acidic plating bath or copper pyrophosphate neutral plating bath can be used. An example of the composition of the copper sulfate acidic plating bath and the plating conditions is shown below:

Composition of Copper Sulfate Acidic Plating Bath and Plating Conditions

| | |
|---|---|
| Copper sulfate | 200 to 250 g/l |
| Sulfuric acid | 10 to 50 g/l |
| Chlorine ions | 20 to 80 mg/l |
| Brightener | Suitable quantity |
| Temperature | 25 to 30° C. |
| Cathode current density | 2 to 5 A/dm$^2$ |

Alternatively, a conductive film 32 can also be formed by depositing for example copper on the barrier metal layer 31 to completely bury the contact hole C2 and interconnection grooves G1 and G2 by an electroless plating treatment that uses a barrier metal layer comprising for example an alloy of cobalt and tungsten as a catalyst film (a layer covering the plating surface in electroless plating).

Because cobalt and nickel are more catalytic than copper, copper can be deposited by electroless plating without further activation of the plating surface.

Below, an example is shown of the composition of the plating bath of the electroless plating treatment for depositing copper and the plating conditions.

Composition of Electroless Plating Bath and Plating Conditions

| | |
|---|---|
| Copper salts | |
| (copper chloride, copper sulfate, copper sulfamate, etc.) | 5 to 50 g/l |
| Chelating agent | |
| (ethylene-diamine, EDTA (ethylene-diaminetetraacetic acid), etc.) | 20 to 40 g/l |
| Reducing agent | |
| (cobalt sulfate etc.) | 25 to 250 g/l |

In the above copper plating treatments by either the electroplating or electroless plating, because pre-processing is not particularly necessary for the surface of the barrier metal layer 31 comprising an alloy of cobalt and tungsten etc, a copper film and a barrier metal layer can be formed sequentially, therefore, metallic bonds are formed between the copper and the barrier metal film and stronger bonding can be achieved.

The above copper plating treatments, both the electroplating and electroless plating, are not limited to the above compositions. Any composition can be used as long as it causes deposition of copper.

In addition, it is preferable that electroless plating of copper be carried out by the puddling treatment employed in the step of forming the barrier metal layer.

In this case, there is an advantage that the two treatments can be performed sequentially and therefore the overall process becomes simple.

After the conductive film 32 is formed, as shown above, by depositing copper on the barrier metal layer 31 to completely bury the contact hole C2 and interconnection grooves G1 and G2, the conductive film 32 that was deposited outside the contact hole C2 and interconnection grooves G1 and G2 is removed by polishing by means of for example chemical mechanical polishing (CMP) and etching back by means of RIE.

Due to the above, as shown in FIG. 1, the inside walls of the communicating contact hole C2 and interconnection groove G1 and of the interconnection groove G2 are covered by a barrier metal film 31a comprised of for example CoWP, and a conductive film 32a comprised of copper is formed to bury the inside of the barrier metal film 31a to form a contact plug P and second interconnection W2 and a third interconnection W3 in the contact hole C2 and interconnection groove G1 and in the interconnection groove G2, respectively. The second interconnection W2 is connected with the first interconnection 30 serving as the lower interconnection through the contact plug P.

According to the electroless plating method and the electroless plating apparatus of the present embodiment for forming a barrier metal layer and the method for forming a conductive film by using the method and apparatus, since a barrier film is formed by electroless plating, a barrier film can be stably and uniformly formed even when interconnections and connection holes are miniaturized and have large aspect ratios. Further, because a processing solution is fed to the plating surface for puddling treatment in at least one of the pre-processing steps of electroless plating and the electroless plating step, the consumption of the processing solution can be reduced.

In particular, a processing solution is shortened in lifetime due to precipitation of $Co(OH)_2$, occurrence of reduction reactions induced by an addition of a reducing agent into the processing solution, or volatilization of ammonia. In the method of electroless plating of the present invention, however, up until immediately before feeding the processing solution to the plating surface, the processing solution is divided into the first solution including a first metallic material and a complexing agent and the second solution including a reducing agent. These are stored in an atmosphere of a nitrogen gas or another inert gas or ammonia gas to prevent volatilization of ammonia and oxidation in the solution. By mixing the first and second solutions and immediately feeding the resultant processing solution to the plating surface, the lifetime of the processing solution can be extended and the consumption can be reduced.

Dividing and storing the processing solution in this way up until just before use becomes possible by adoption of the above puddling treatment of the processing solution.

Second Embodiment

Figure 12:
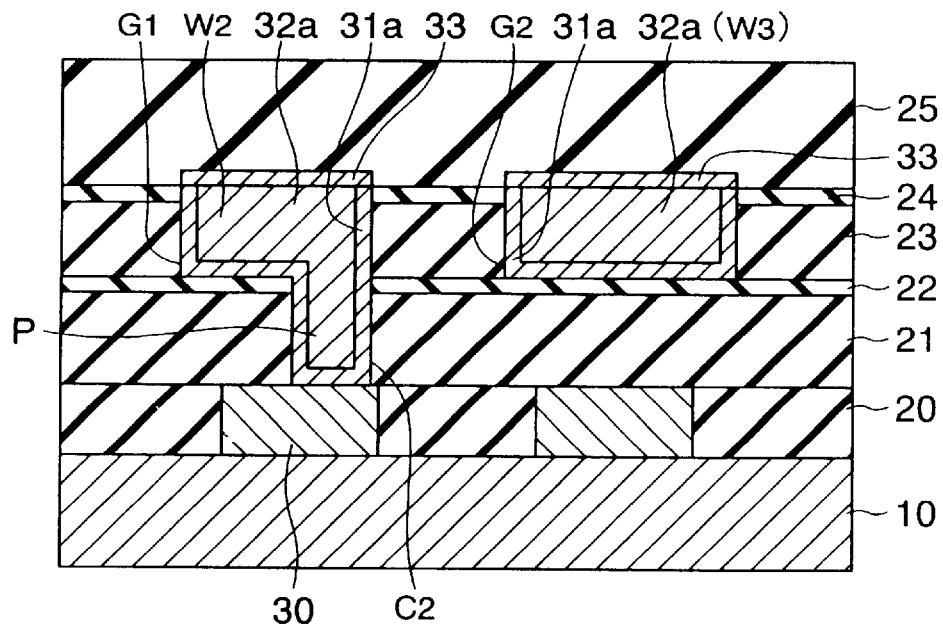
FIG. 12 is a sectional view of a semiconductor device obtained by an electroless plating method and apparatus according to a second embodiment of the present invention.

FIG. 12 is a sectional view of a semiconductor device formed with a conductive film by using a method for forming a conductive film according to the present embodiment.

This apparatus is substantially the same as that of FIG. 1, except that the contact hole C2 and interconnection groove GI and the interconnection groove G2 are buried with a conductive film 32a comprised of for example copper, a barrier metal layer 33 is formed on that surface, and a fourth insulating film 25 comprised of silicon oxide is formed on that.

The upper barrier metal 33 is formed to prevent the copper that constitutes the conductive film 32a from diffusing to the fourth insulating film 25.

Below, an explanation will be made of the above method for forming a conductive film with reference to relevant figures.

First, the steps are the same as the first embodiment until the structure shown in FIG. 1 is formed.

Figure 13:
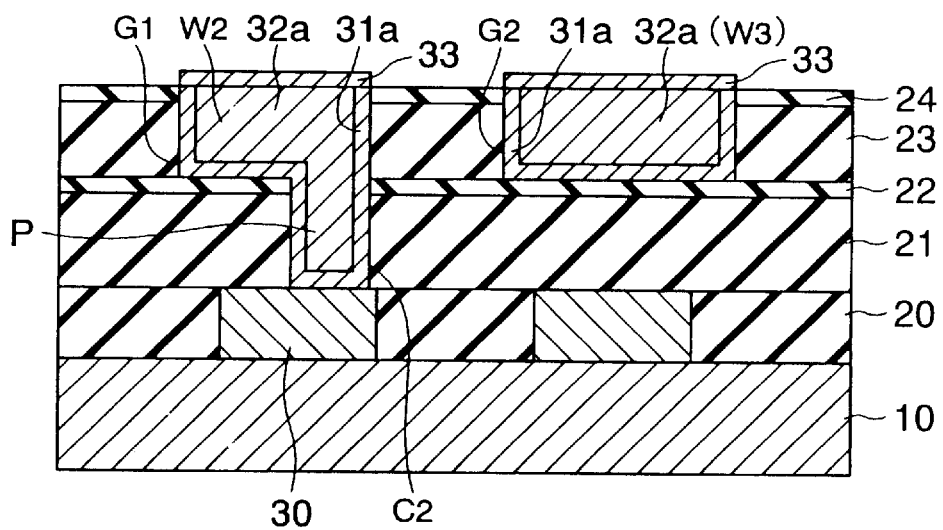
FIG. 13 is a schematic sectional view illustrating the steps of a method of forming a conductive film in the semiconductor device shown in FIG. 12 showing the steps up to forming an upper barrier layer.

Next, as shown in FIG. 13, a barrier metal film 33 comprised of for example CoWP (an alloy of cobalt and tungsten containing phosphorous) is formed by electroless plating on the conductive film 32a.

In forming the above barrier metal film 33, as pre-processing for the electroless plating, it is necessary to activate (catalyze) the surface of the plating surface, that is, the conductive layer 32a, by using palladium or another highly catalytic metal. As an example, the steps illustrated below can be performed for the activation (catalyzation).

(1) Degreasing

The surface of the conductive film 32a is degreased by alkali treatment to raise its wettability.

(2) Acid Treatment

Next, the plating surface is neutralized by treatment by 2 to 3% hydrochloric acid to remove the copper oxide film from the surface. Note that this step can be omitted because a hydrochloric acid solution of palladium chloride is used in the next step.

(3) Catalyzation

Next, a hydrochloric acid solution of palladium chloride solution (palladium substitution solution) is used to replace the copper in the outermost layer of the copper conductive film 32a with palladium for catalyzation. This is substitution plating and uses the different ionization tendencies of different metals. Copper is electrically and chemically a base metal compared with palladium (stronger tendency of ionization), therefore along with dissolution in a solution, the released electrons are transferred to the noble metal palladium in the solution, and metal palladium is deposited on the surface of the base metal copper. Because the palladium is already exposed in this catalyzation, the activation as in the first embodiment is not necessary.

The above palladium substitution solution can be adjusted to a pH value of 1 to 2 at a temperature of 30 to 50° C.

After the above acid treatment and catalyzation, the surface of the conductive film 32a may be rinsed with pure water when necessary.

Note that the (1) degreasing and the (2) acid neutralization are performed only when necessary.

After the activation of the plating surface in the above way, electroless plating is performed on the semiconductor substrate 10, metal is reduced on the exposed palladium, and a barrier metal layer 31 of a uniform thickness is formed on the entire plating surface.

In the above method, because in principle the catalyzation is performed only on the copper surface, the barrier metal layer 31 is only formed on the copper surface by the electroless plating.

The electroless plating method and the electroless plating apparatus of the present invention are used for the above activation of the plating surface and electroless plating for forming the barrier metal layer 31.

Namely, in the same way as the first embodiment, as shown in FIGS. 5A to 5C, puddling treatment is used for the processing solutions used for the catalyzation of the pre-processing for electroless plating for forming the above barrier metal layer or for the electroless plating for forming the barrier metal layer.

Puddling treatment may also be used for both of the above two steps.

When using puddling treatment for the catalyzation, the methods for heating in the electroless plating explained in the first embodiment can be used to heat the processing solution to maintain the palladium substitution solution at a predetermined temperature.

In addition, the method of performing electroless plating by puddling treatment is the same as the first embodiment.

According to the electroless plating method and the electroless plating apparatus of the present embodiment for forming a barrier metal layer and the method for forming a conductive film by using the method and apparatus, in the same way as the first embodiment, since a barrier film is formed by electroless plating, a barrier film can be stably and uniformly formed even when interconnections and connection holes are miniaturized and have large aspect ratios. Further, because a processing solution is fed to the plating surface for puddling treatment in at least one of the pre-processing steps of electroless plating and the electroless plating step, the consumption of the processing solution can be reduced.

In particular, a processing solution is shortened in lifetime due to precipitation of $Co(OH)_2$, occurrence of reduction reactions induced by an addition of a reducing agent into the processing solution, or volatilization of ammonia. In the method of electroless plating of the present invention, however, up until immediately before feeding the processing solution to the plating surface, the processing solution is divided into the first solution including a first metallic material and a complexing agent and the second solution including a reducing agent. These are stored in an atmosphere of a nitrogen gas or another inert gas or ammonia gas to prevent volatilization of ammonia and oxidation in the solution. By mixing the first and second solutions and immediately feeding the resultant processing solution to the plating surface, the lifetime of the processing solution can be extended and the consumption can be reduced.

Dividing and storing the processing solution in this way up until just before use becomes possible by adoption of the above puddling treatment of the processing solution.

Third Embodiment

Figure 14:
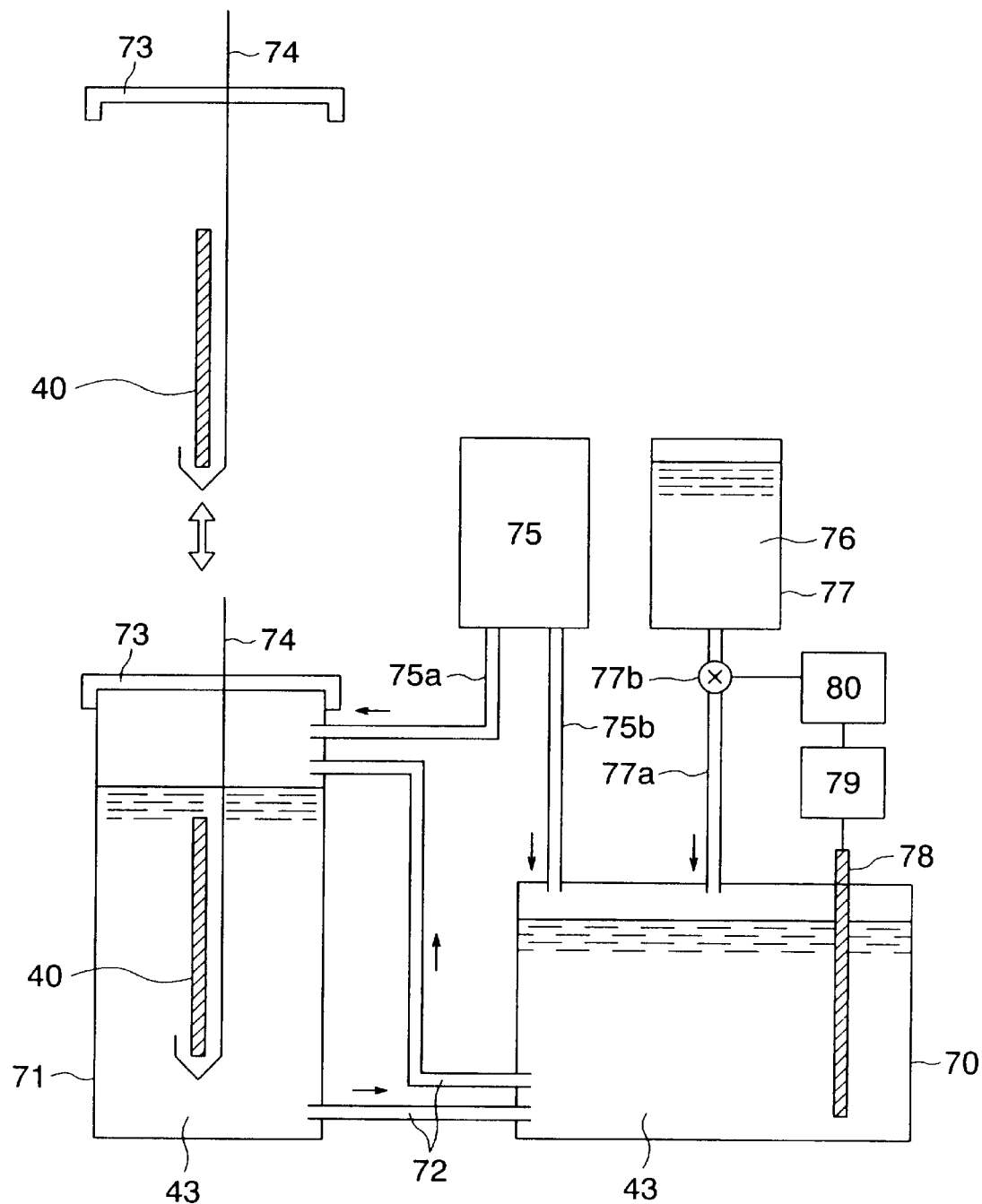
FIG. 14 is a sectional view of an electroless plating apparatus according to a third embodiment of the present invention.

FIG. 14 is a sectional view of an electroless plating apparatus according to the present embodiment.

In the present embodiment, using the apparatus shown in FIG. 14, a CoWP (alloy of cobalt and tungsten containing phosphorous) barrier metal layer is formed to cover the entire surface of the inside walls of contact hole and interconnection grooves as in the first embodiment or on a copper conductive film as in the second embodiment.

The electroless plating processing solution 43 is stored in a plating processing solution tank 70 that is closed except for portions for connecting pipes and in a plating bath 71 whose top is open. The electroless plating processing solution 43 is circulated through the pipes by using a not shown pump. The plating processing solution tank 70 and the plating bath 71 are provided with not illustrated heaters to maintain the electroless plating processing solution 43 at a predetermined temperature.

The above electroless plating processing solution 43 includes the first metallic material supplying for example cobalt or nickel or another main ingredient of the barrier metal layer acting as a conductive film, a first complexing agent of an amphoteric ion type (the first chelating agent), a second complexing agent for enhancing a plating reaction (the second chelating agent), a reducing agent, and a pH adjusting agent. If necessary, it may further include a second metallic material containing tungsten or molybdenum for raising the barrier ability of the barrier layer.

In the above electroless plating process, if the molar ratios of the metal salt, chelating agent (total when using two or more), and the reducing agent are not proper, the CoP film or CoWP film will not be deposited or a film without luster will be deposited.

The surface roughness of a lustrous film is approximately Ra=0.6 nm or similar with that of the copper interconnections.

On the other hand, the surface roughness of a film without luster is about Ra=5 nm. This shows that a dense film is not obtained.

For the electroless plating processing solution 43, the same processing solution of the same quantity as the first embodiment can be used. Particularly, by formulating the composition to include three or more moles of complexing agent and three or more moles of reducing agent for one mole of the first metallic material, a uniform film can be formed stably by electroless plating. Furthermore, by adjusting the pH value of the electroless plating processing solution 43 to 9 or more, a dense and high quality plating film giving the formed barrier metal layer a lustrous surface is obtainable.

The processed wafer 40 may be immersed in the electroless plating processing solution 43 in the plating bath 71 for electroless plating while being supported by a holder 74 so as to form a barrier film comprised of CoP, CoWP, CoMoP, NiWP, NiMoP, etc. in the same way as the first embodiment.

During this treatment, the opening of the plating bath 71 is covered by a lid 73. Further, the treatment is performed while feeding nitrogen gas or another inert gas or ammonia gas or another gas from a gas supplier 75 through a pipe 75a to the closed plating bath 71 to give it an inert gas or ammonia gas atmosphere. The pipe 75b from the gas supplier 75 is also connected with the plating processing solution tank 70. The electroless plating processing solution 43 in the plating processing solution tank 70 is stored in an atmosphere of an inert gas or ammonia gas.

In the above electroless plating processing solution 43, because cobalt will form cobalt hydroxide ($Co(OH)_2$) precipitates in an alkaline solution, a chelating agent is used to create a stable chelating state. Even so, if the processing solution is exposed to oxygen (air) for a long time, precipitation of $Co(OH)_2$ occurs.

As shown above, precipitation of $Co(OH)_2$ is preventable by sealing the plating processing solution tank 70 and the plating bath 71 and by storing the electroless plating processing solution 43 in an atmosphere of an inert gas or ammonia gas.

A pH adjusting agent tank 77 storing a pH adjusting agent 76 such as ammonia water, tetramethylammonium hydroxide (TMAH), etc. is connected with the plating processing solution tank 70 via a pipe 77a. The pH adjusting agent 76 can be added to the plating processing solution tank 70 when a valve 77b provided in the pipe 77a is opened.

The plating processing solution tank 70 is provided with a pH meter 79 with a pH detector 78 immersed in the electroless plating processing solution 43. The result of pH measurement is output to a pH controller 80.

When the measured pH is less than 9, the pH controller 80 controls (operates) the valve 77b to add a suitable amount of pH adjusting agent 76 to the plating processing solution tank 70 so that the pH value of the electroless plating processing solution 43 in the plating processing solution tank 70 is kept at not less than 9.

When the electroless plating processing solution contains tungsten or molybdenum, the chelating state becomes unstable and the lifetime of the electroless plating processing solution becomes less than one day. Unless the molar ratio of ammonia to tungstic acid in the ammonium tungstate is at least 2, the ammonium tungstate cannot exist in an aqueous solution state, and crystals of the tungstic acid will precipitate. Therefore, if the plating solution is left opened, the ammonia volatilizes, the pH falls, the molar ratio of ammonia to tungstic acid becomes less than 2, causing separation and precipitation of crystals. In actuality, crystallization of tungstic acid can be observed when the pH becomes less than 9.

If the tungstic acid crystallizes, coprecipitation occurs when a CoWP barrier metal film is precipitated resulting in areas without luster on the surface of the plating film. The surface roughness in this case is 5 nm or so similar with that mentioned previously.

By storing the electroless plating processing solution 43 in an atmosphere of a nitrogen gas or other inert gas or ammonia gas, volatilization of ammonia and a decrease of pH can be prevented. Furthermore, by monitoring and controlling the pH value so that it never fall below 9, the lifetime of the electroless plating processing solution 43 can be extended to for example six months or so.

As described above, according to the electroless plating apparatus of the present embodiment, by storing the processing solution in an atmosphere of nitrogen or other inert gas or ammonia gas, feeding the processing solution to the plating surface in a pressurized atmosphere of an inert gas or ammonia gas, and controlling the pH value of the electroless plating processing solution to 9 or more, fluctuations in the composition of the processing solution due to precipitation is prevented, the lifetime of the processing solution can be extended, and the waste of the processing solution and therefore the consumption of the processing solution can be reduced.

Fourth Embodiment

Figure 15:
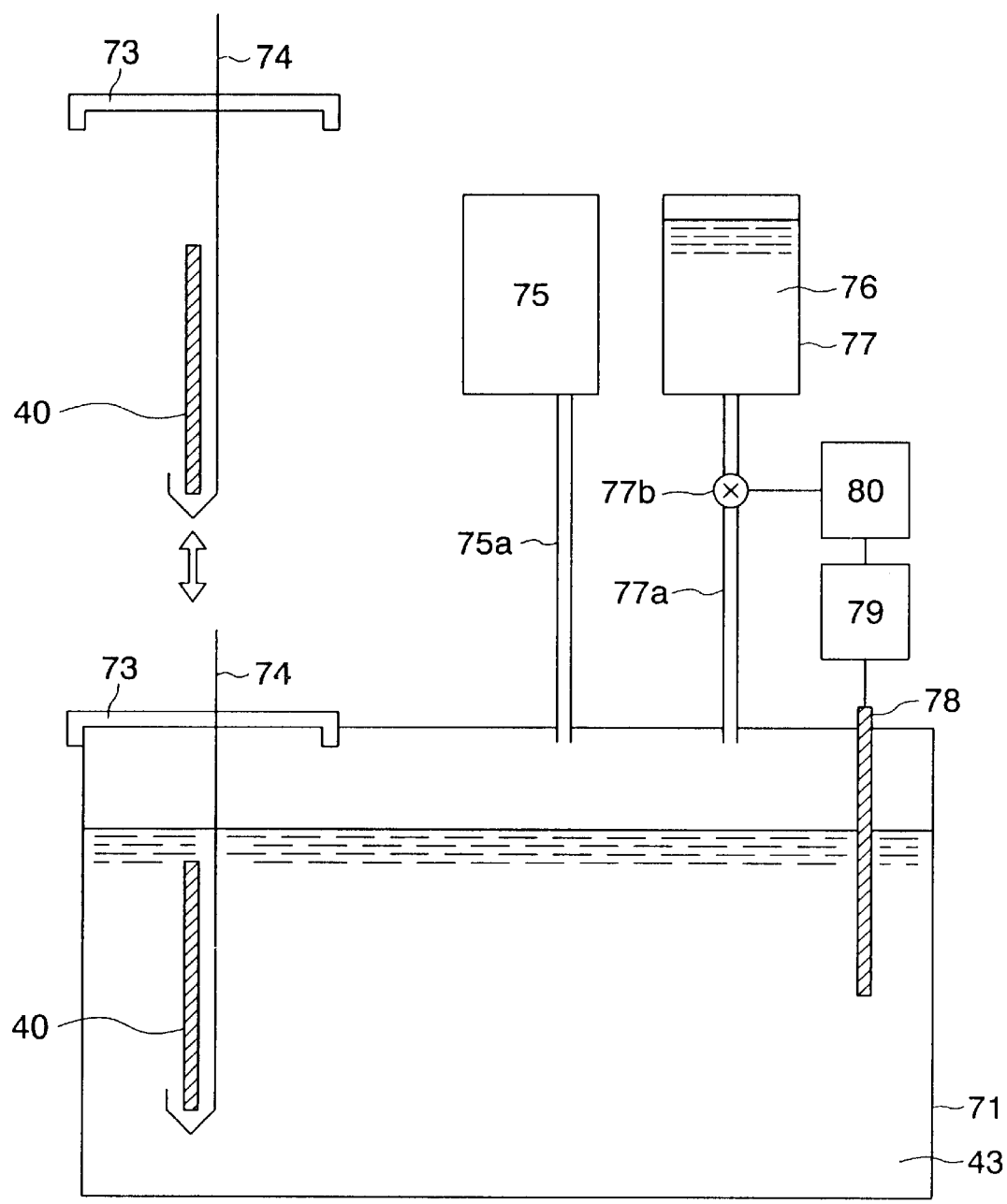
FIG. 15 is a sectional view of an electroless plating apparatus according to a fourth embodiment of the present invention.

FIG. 15 is a sectional view of an electroless plating apparatus according to the present embodiment.

This apparatus is substantially the same as that of the third embodiment, except that the plating processing solution tank 70 and the plating bath 71 are made integral.

Namely, an electroless plating processing solution 43 the same as that of the third embodiment is stored in a plating processing solution tank 71 which has part of its top open. The same electroless plating processing solution of the same quantity as that of the first embodiment solution can be used. Particularly, by comprising the solution to contain three or more moles of completing agent and three or more moles of reducing agent for one mole of the first metallic material, a uniform film can be stably formed by electroless plating. Furthermore, with the pH value of the electroless plating processing solution 43 adjusted to 9 or more, a dense and high quality plating film giving the obtained barrier metal layer a lustrous surface is obtainable.

The processed wafer 40 is immersed in the electroless plating processing solution 43 in the plating bath 71 for electroless plating while being supported by a holder 74 so as to form a barrier film comprised of CoP, CoWP, CoMoP, NiWP, NiMoP, etc.

During this treatment, the opening of the plating bath 71 is closed by a lid 73. Further, the treatment is performed while feeding nitrogen gas or another inert gas or ammonia gas or another gas from a gas supplier 75 through a pipe 75a to the closed plating bath 71 to give it an inert gas or ammonia gas atmosphere.

A pH adjusting agent tank 77 storing a pH adjusting gent 76 is connected with the plating bath 71 via a pipe 77a. The pH adjusting agent 76 can be added to the plating bath 71 when a valve 77b provided in the pipe 77a is opened.

The plating bath 71 is further provided with a pH meter 79 with a pH detector 78 immersed in the electroless plating processing solution 43. The result of pH measurement is output to a pH controller 80.

When the measured pH is less than 9, the pH controller 80 controls (operates) the valve 77b to add a suitable amount of pH adjusting agent 76 to the plating bath 71 so that the pH value of the electroless plating processing solution 43 in the plating bath 71 becomes at least 9.

As described above, according to the electroless plating apparatus of the present embodiment, by storing the electroless plating processing solution in an atmosphere of nitrogen or other inert gas or ammonia gas, feeding the processing solution to the plating surface in a pressurized atmosphere of an inert gas or ammonia gas, and controlling the pH value of the electroless plating processing solution to 9 or more, the fluctuation of the composition of the processing solution due to precipitation is prevented, the lifetime of the processing solution can be extended, and the waste of the processing solution and therefore the consumption of the processing solution can be reduced.

Fifth Embodiment

Figure 16:
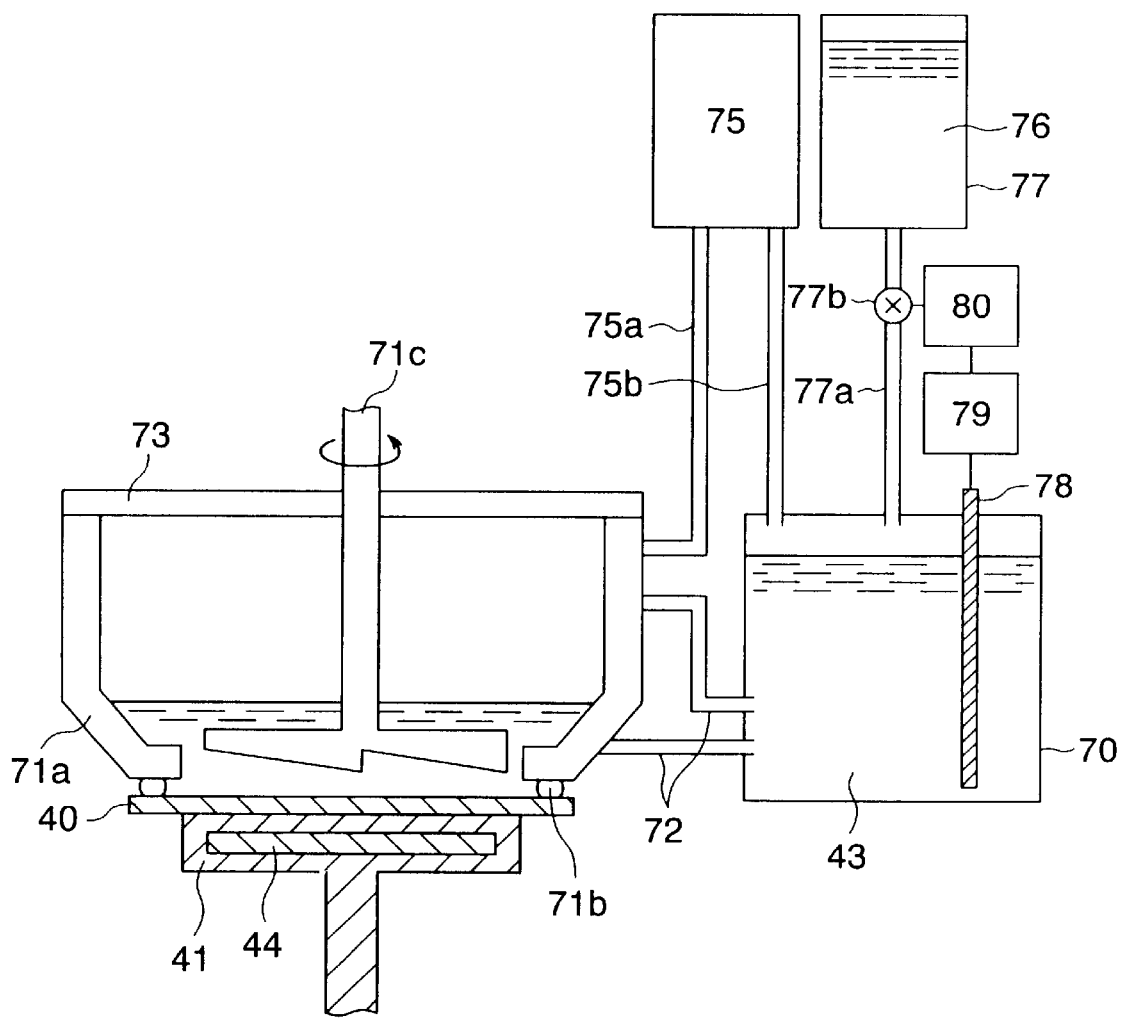
FIG. 16 is a sectional view of an electroless plating apparatus according to a fifth embodiment of the present invention.

FIG. 16 is a sectional view of an electroless plating apparatus according to the present embodiment.

This apparatus is substantially the same as that of the third embodiment, except the plating bath 71 is replaced by a plating cup.

Namely, using a not illustrated electrostatic chuck or other mechanism, a processed wafer 40 is placed on a turntable 41 having a built-in heater 44. Above the wafer 40, there is provided a plating cup (plating cell) 71a which is open at the top and bottom and has a not shown built-in heater. The contact portion between the plating cup 71a and the processed wafer 40 is sealed by a sealing member 71b. In this way, the plating surface of the wafer 40 is placed to look inside the plating cell and at least the plating surface is separated from the outside atmosphere.

An electroless plating processing solution 43 is stored in a plating processing solution tank 70 closed except for portions for connecting pipes. A not shown pump is used to supply the electroless plating processing solution 43 to the plating cell and recover it through pipes 72.

When the electroless plating processing solution 43 is fed to the above plating cell, electroless plating proceeds with stirring by a stirrer 71c to form a barrier film comprised of CoP, CoWP, CoMoP, NiWP, NiMoP, etc.

In this treatment, the same electroless plating processing solution of the same quantity as that of the first embodiment solution can be used. Particularly, by comprising it with a ratio of three or more moles of complexing agent and three or more moles of reducing agent to one mole of the first metallic material, a uniform film can be formed stably by the electroless plating. Furthermore, with the pH value of the electroless plating processing solution 43 adjusted to 9 or more, a dense and high quality plating film giving the obtained barrier metal layer a lustrous surface is obtainable.

In this treatment, the plating cell 71a is covered by a lid 73 and the treatment is performed while feeding nitrogen gas or another inert gas or ammonia gas or other gas from a gas supplier 75 to create an atmosphere of an inert gas or ammonia gas. The pipe 75b from the gas supplier 75 is also connected with the plating processing solution tank 70. The electroless plating processing solution 43 in the plating processing solution tank 70 is stored in an atmosphere of an inert gas or ammonia gas.

In addition, a pH adjusting agent tank 77 storing a pH adjusting agent 76 such as ammonia water, tetramethylammonium hydroxide (TMAH), etc. is connected with the plating processing solution tank 70 via a pipe 77a. The pH adjusting agent 76 can be added to the plating processing solution tank 70 when a valve 77b provided in the pipe 77a is opened.

The plating processing solution tank 70 is provided with a pH meter 79 with a pH detector 78 immersed in the electroless plating processing solution 43. The result of pH measurement is output to a pH controller 80.

When the measured pH is less than 9, the pH controller 80 controls (operates) the valve 77b to add a suitable amount of pH adjusting agent 76 to the plating processing solution tank 70 so that the pH value of the electroless plating processing solution 43 in the plating processing solution tank 70 becomes at least 9.

After the above electroless plating, the plating processing solution is collected from the plating cell. A not shown mechanism is then used to move the plating cup 71a and the sealing member 71b upward and separate them from the processed wafer 40, whereby the residual plating processing solution on the processed wafer 40 can be spun off by rotating the turntable 41.

Further, after the turntable 41 is stopped, a not shown pipe supplies pure water to clean the plating surface of the processed wafer 40 and other places.

As described above, by storing the processing solution in an atmosphere of nitrogen or another inert gas or ammonia gas, feeding the processing solution to the plating surface in a pressurized atmosphere of an inert gas or ammonia gas, and controlling the pH value of the electroless plating processing solution to 9 or more, the fluctuation of the composition of the processing solution due to precipitation is prevented, the lifetime of the processing solution can be extended, and the waste of the processing solution and therefore the consumption of the processing solution can be reduced.

EXAMPLE 1

Electroless plating of a CoWP film was performed by using electroless plating processing solutions prepared to have molar ratios of the metal salt (cobalt chloride), chelating agent, and reducing agent as shown in Table 1.

As conditions other than the molar ratio of the metal salt (cobalt chloride), chelating agent, and reducing agent, the content of ammonium tungstate was made 0.01 to 0.1 mole to 1 mole of metal salt, the temperature of the electroless plating bath was made 70° C. to 90° C., and the pH value of the electroless plating processing solution was made 9 to 9.5.

The state of precipitation of the obtained plating films was observed. The results are also shown in Table 1.

TABLE 1

| Metal salt | Chelating agent | Reducing agent | Condition of precipitation |
|---|---|---|---|
| 1 | 1.5 | 5 | Very poor (no precipitation) |
| 1 | 1.5 | 8 | Fair (some areas of no luster) |
| 1 | 1.5 | 10 | Fair (some areas of no luster) |
| 1 | 2 | 2 | Poor (no luster at all) |
| 1 | 2 | 5 | Fair (some areas of no luster) |
| 1 | 2 | 8 | Fair (some areas of no luster) |
| 1 | 3 | 2 | Fair (some areas of no luster) |
| 1 | 3 | 3 | Good (lustrous) |
| 1 | 3 | 5 | Good (lustrous) |
| 1 | 3 | 8 | Good (lustrous) |

* Numbers in the table indicate molar ratios in the electroless plating processing solutions.

Table 1 reveals that a molar ratio of not less than 3 for each of the chelating agent and reducing agent with respect to the metal salt is required to obtain a dense high quality plating film giving a lustrous surface.

EXAMPLE 2

One liter of an electroless plating processing solution having a molar ratio of 3 moles of chelating agent and 3 moles of reducing agent to 1 mole of metal salt (cobalt chloride) of Example 1 was prepared. An 8-inch copper surface wafer activated on its surface was immersed into the solution for electroless plating of a CoWP film.

In this experiment, the electroless plating bath was purposely left open at the top and was not made an atmosphere of nitrogen gas or ammonia gas. The processing solution was heated to 70° C., whereupon the ammonia volatilized and the pH value changed during the treatment.

In this experiment, the copper surface wafer was plated while measuring the pH value of the electroless plating bath. When the measured pH value was less than 9, ammonia was added to return the pH value to at least 9. A total of 15 wafers were plated in the following order.

The pH value in each step and the conditions of precipitation of the obtained plating film were observed. The results are shown in Table 2.

TABLE 2

| No. of treated wafers | pH | Condition of precipitation |
|---|---|---|
| 1 | 9.23 | Good (lustrous) |
| 2 | 9.22 | Good (lustrous) |
| 3 | 9.11 | Good (lustrous) |
| 4 | 9.05 | Good (lustrous) |
| 5 | 9.03 | Good (lustrous) |
| 6 | 8.88 | Fair (some areas of no luster) |
| — | Ammonia added | |
| 7 | 9.11 | Good (lustrous) |
| 8 | 9.07 | Good (lustrous) |
| 9 | 8.95 | Fair (some areas of no luster) |

TABLE 2-continued

| No. of treated wafers | pH | Condition of precipitation |
|---|---|---|
| — | Ammonia added | |
| 10 | 9.21 | Good (lustrous) |
| 11 | 9.15 | Good (lustrous) |
| 12 | 9.12 | Good (lustrous) |
| 13 | 9.06 | Good (lustrous) |
| 14 | 8.93 | Fair (some areas of no luster) |
| — | Ammonia added | |
| 15 | 9.12 | Good (lustrous) |

Table 2 shows that lustrous films could not be obtained if the pH fell to less than 9 due to the volatilization of ammonia during treatment and that and if the pH was returned to 9 or more by adding ammonia, a dense high quality plating film giving a lustrous surfaces became obtainable again.

Figure 17:
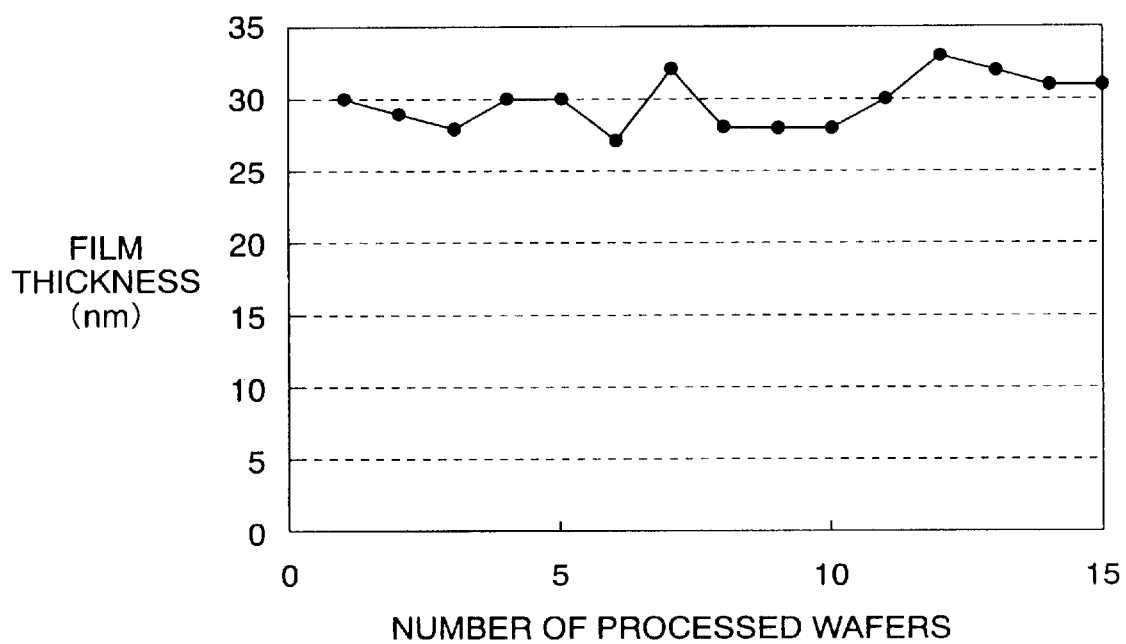
FIG. 17 is a graph illustrating the dependence of the thickness of a formed film on the number of processed wafers in the example 2.

The thicknesses of the obtained plating films was measured. The results are shown in FIG. 17.

As time passed, even if the pH value was adjusted by ammonia, no major fluctuation was seen in the rate of film formation. The thickness settled at 30 nm or so.

These results reveal that plating of 15 8-inch wafers is possible with one liter of electroless plating processing solution of the above composition if a thickness of 30 nm is required for a barrier metal layer.

In actuality, in this example, too much ammonia was added for pH adjustment, so the processing solution overflowed from the plating bath. As a result, it was not possible to process more than 15 wafers. However, with the apparatuses of the third to fifth embodiments described above, if storing the electroless plating processing solution in an atmosphere of an inert gas or ammonia gas and feeding the processing solution to the plating surface in an pressurized atmosphere of an inert gas or ammonia gas, it should be possible to process more than 15 8-inch wafers.

Further, in this example, full copper surface wafers were used. In usual wafer treatment, the area processed by electroless plating is at most 50% of the total wafer surface area. Assuming this, it should be possible to process more than 30 8-inch wafers by one liter of electroless plating processing solution of the above composition.

EXAMPLE 3

One liter of the electroless plating processing solution having a molar ratio of 3 moles of chelating agent and 3 moles of reducing agent to 1 mole of metal salt (cobalt chloride) of Example 1 was prepared and adjusted in its pH value to 9 or more.

The thus prepared electroless plating processing solution was stored at ordinary temperature in a nitrogen gas atmosphere for six months, then was used for electroless plating of a CoWP film in the same way as Example 2. It was confirmed that same plating film as that formed using a newly prepared processing solution was obtained.

The results were the same for CoP, CoMoP, NiWP, and NiMoP films.

The semiconductor device formed with a conductive film by the present invention may be a MOS transistor semiconductor device, bipolar semiconductor device, BiCMOS semiconductor device, logic and memory type semiconductor device, etc. The invention may be applied to any semiconductor device as long as it has connection holes like contact holes or via holes and interconnection grooves.

The electroless plating bath and the method for forming a conductive film of the present invention are not limited to the above embodiments.

For example, the puddling treatment of the processing solution may be also be used for just one of the hydrophilization, coupling, catalyzation, and activation steps.

Further, the method for forming a conductive film comprised of a cobalt tungsten alloy barrier metal film may be applied to either the damascene process (process for forming interconnection grooves) or the dual damascene process (process for forming interconnections and contact holes simultaneously) and may be applied to the process for forming just contact holes.

In addition, materials other than copper can also be used as the conductive materials to bury interconnection grooves and contact holes on the barrier metal layer.

Further, in the above embodiments, a spin-coater was used for the electroless plating, but the present invention is not limited to this. For example, the electroless plating and one of the pre-processing steps may be performed by puddling treatment on a conveyance roller.

Further, the present invention is not limited to miniaturized interconnections of a semiconductor wafer (semiconductor device) and may also be applied to plating of other metals and plating of printed circuit boards.

Other numerous modifications may also be made without departing from the basic concept and scope of the present invention.

Summarizing the effects of the present invention, as described above, according to the electroless plating method and the electroless plating apparatus of the present invention, since a barrier film is formed by electroless plating, a barrier film can be stably and uniformly formed even when interconnections and connection holes are miniaturized and have large aspect ratios.

Further, because a processing solution is fed to the plating surface for puddling treatment in at least one of the pre-processing steps of electroless plating and the electroless plating step, the consumption of the processing solution can be reduced.

In particular, a processing solution is shortened in lifetime due to precipitation of $Co(OH)_2$, occurrence of reduction reactions induced by an addition of a reducing agent into the processing solution, or volatilization of ammonia. In the method of electroless plating of the present invention, however, up until immediately before feeding the processing solution to the plating surface, the processing solution is divided into the first solution including a first metallic material and a complexing agent and the second solution including a reducing agent. These are stored in an atmosphere of a nitrogen gas or another inert gas or ammonia gas to prevent volatilization of ammonia and oxidation in the solution. By mixing the first and second solutions and immediately feeding the resultant processing solution to the plating surface, the lifetime of the processing solution can be extended and the consumption can be reduced.

Dividing and storing the processing solution in this way up until just before use becomes possible by adoption of the above puddling treatment of the processing solution.

Because the processing solution necessary for treatment is prepared by mixing immediately before use, the materials added into the processing solution can be used efficiently. Further, fluctuation of the film formation rates between different treatments can be suppressed, and the uniformity of the thickness and resistance on a processed wafer can be raised.

Further, by comprising the solution with a molar ratio of three or more moles of complexing agent and three or more moles of reducing agent relative to one mole of the first metallic material, a film can be formed stably and uniformly by electroless plating. Further, by adjusting the pH value to not less than 9 by a pH adjusting agent, a dense and high quality plating film giving a lustrous surface can be formed.

In addition, by storing the electroless plating processing solution in an atmosphere of nitrogen gas or another inert gas or ammonia gas, volatilization of ammonia and a fall of the pH value are preventable. Further, by controlling the pH value to be 9 or more at all times, the lifetime of the processing solution can be increased and the amount of waste of the processing solution waste therefore the consumption of the processing solution can be reduced.

What is claimed is:

1. A method of electroless plating for processing a plating surface to form a barrier layer on a substrate, comprising a step of
   feeding a processing solution used in at least one of the pre-processing steps of the electroless plating and the electroless plating step to the plating surface for puddling treatment, wherein the processing solution includes a first metallic material supplying a main ingredient of said barrier layer, a first complexing agent of an amphoteric ion type, a second complexing agent adapted to promote a plating reaction, a pH adjusting agent;
   said processing solution is prepared divided into a first solution and a second solution, wherein the second solution includes a reducing agent;
   the first and second solutions are mixed to obtain said processing solution before feeding to said plating surface;
   wherein said puddling treatment comprises:
      placing the processing solution on the substrate while the substrate is substantially rotationally fixed;
      allowing the processing solution to remain on the substrate a predetermined amount of time; and
      rotating the substrate to remove excess processing solution.

2. A method of electroless plating as set forth in claim 1, wherein puddling treatment is performed with a processing solution used in said electroless plating step.

3. A method of electroless plating as set forth in claim 1, wherein puddling treatment is performed with a processing solution used in at least one of the pre-processing steps of hydrophilization, coupling, catalyzation, and activation.

4. A method of electroless plating as set forth in claim 1, wherein puddling treatment is performed with a processing solution used in at least one of the pre-processing steps of degreasing, acid neutralization, and catalyzation.

5. A method of electroless plating as set forth in claim 1, including a step of removing an unnecessary processing solution after said puddling treatment.

6. A method of electroless plating as set forth in claim 5, wherein said processing solution is fed by a spin-coater, then the spin-coater is stopped for the puddling treatment with the processing solution, then the spin-coater is again operated to remove the unnecessary processing solution.

7. A method of electroless plating as set forth in claim 5, wherein said puddling treatment step and the step of removing the unnecessary processing solution are repeated.

8. A method of electroless plating as set forth in claim 2, wherein a processing solution including at least a first metallic material supplying a main ingredient of said barrier layer, a complexing agent, the reducing agent, and a pH adjusting agent and having a pH value adjusted in a region from neutral to alkali is used for said puddling treatment as said processing solution in said electroless plating step.

9. A method of electroless plating as set forth in claim 8, wherein as said processing solution, use is made of a processing solution further including a second metallic material supplying an ingredient enhancing the barrier ability of said barrier layer.

10. A method of electroless plating as set forth in claim 8, wherein said second solution includes a second metallic material supplying an ingredient enhancing the barrier ability of said barrier layer.

11. A method of electroless plating as set forth in claim 8, wherein after said first and second solutions are mixed, the mixed solution is immediately fed to said plating surface.

12. A method of electroless plating as set forth in claim 8, wherein said first and second solutions are stored in an atmosphere of an inert gas or ammonia gas until feeding said processing solution to said plating surface.

13. A method of electroless plating as set forth in claim 8, wherein said first and second solutions are stored in a pressurized atmosphere of an inert gas or ammonia gas until feeding said processing solution to said plating surface.

14. A method of electroless plating as set forth in claim 9, wherein
   said processing solution is prepared divided into a first solution including said first metallic material and said complexing agent, a second solution including said reducing agent, and a third solution including said second metallic material and
   the first, second, and third solutions are mixed to obtain said processing solution before feeding to said plating surface.

15. A method of electroless plating as set forth in claim 14, wherein said first, second, and third solutions are stored in an atmosphere of an inert gas or ammonia gas until feeding said processing solution to said plating surface.

16. A method of electroless plating as set forth in claim 14, wherein said first, second, and third solutions are stored in a pressurized atmosphere of an inert gas or ammonia gas until feeding said processing solution to said plating surface.

17. A method of electroless plating as set forth in claim 8, wherein said first metallic material includes at least a compound of nickel or cobalt.

18. A method of electroless plating as set forth in claim 9, wherein said second metallic material includes at least a compound of tungsten or molybdenum.

19. A method of electroless plating as set forth in claim 18, wherein the atomic weight concentration of said tungsten or molybdenum is 0.2% to 2%.

20. A method of electroless plating as set forth in claim 1, wherein said first complexing agent is an amino acid.

21. A method of electroless plating as set forth in claim 1, wherein said second complexing agent is an organic acid.

22. A method of electroless plating as set forth in claim 8, wherein said complexing agent, said reducing agent, and said pH adjusting agent substantially do not contain a metal in their chemical formulae.

23. A method of electroless plating as set forth in claim 8, wherein the pH value of said processing solution is adjusted to 7 to 12.

24. A method of electroless plating as set forth in claim 9, wherein the pH value of said processing solution is adjusted to 8 to 12.

25. A method of electroless plating as set forth in claim 8, wherein the pH values of said first and second solutions are adjusted to 7 to 12, respectively.

26. A method of electroless plating as set forth in claim 10, wherein the pH values of said first and second solutions are adjusted to 8 to 12, respectively.

27. A method of electroless plating as set forth in claim 14, wherein the pH values of said first, second, and third solutions are adjusted to 8 to 12, respectively.

28. A method of electroless plating as set forth in claim 8, wherein the temperature of said processing solution is adjusted to 50° C. to 95° C.

29. A method of electroless plating as set forth in claim 8, wherein the temperature of said first and second solutions are adjusted to 50° C. to 95° C.

30. A method of electroless plating as set forth in claim 14, wherein the temperatures of said first, second, and third solutions are adjusted to 50° C. to 95° C.

31. A method of electroless plating as set forth in claim 1, wherein said processing solution is sprayed onto said plating surface by a spray nozzle.

32. A method of electroless plating as set forth in claim 8, wherein as said processing solution of said electroless plating step, use is made of a processing solution containing three or more moles of said complexing agent and three or more moles of said reducing agent to one mole of said first metallic material.

33. A method of electroless plating as set forth in claim 32, wherein as said processing solution of said electroless plating step, use is made of a processing solution having a pH value adjusted to 9 or more.

34. A method of electroless plating as set forth in claim 33, wherein the pH value of said processing solution of said electroless plating step is monitored and when the pH value is less than 9, said pH adjusting agent is further added to increase the pH value to 9 or more.

35. A method of electroless plating for processing a plating surface to form a barrier layer, wherein as a processing solution of an electroless plating step, use is made of a processing solution at least containing, with respect to one mole of a first metallic material supplying a main ingredient of said barrier layer, three or more moles of a complexing agent, a second complexing agent adapted to promote a plating reaction, three or more moles of a reducing agent, and a pH adjusting agent and having a pH value adjusted in the region from neutral to alkali wherein said complexing agent, said reducing agent, and said pH adjusting agent substantially do not contain a metal in their chemical formulae.

36. A method of electroless plating as set forth in claim 35, wherein as said processing solution of said electroless plating step, use is made of a processing solution of a pH value adjusted to 9 or more.

37. A method of electroless plating as set forth in claim 36, wherein the pH value of said processing solution of said electroless plating step is monitored and, when the pH value is less than 9, said pH adjusting agent is further added to increase the pH value to 9 or more.

38. A method of electroless plating as set forth in claim 35, wherein as pre-processing steps of said electroless plating, hydrophilization, coupling, catalyzation, and activation are performed.

39. A method of electroless plating as set forth in claim 35, wherein as pre-processing steps of said electroless plating, degreasing, acid neutralization, and catalyzation are performed.

40. A method of electroless plating as set forth in claim 35, wherein as said processing solution, use is made of a processing solution further including a second metallic material supplying an ingredient enhancing the barrier ability of said barrier layer.

41. A method of electroless plating as set forth in claim 35, wherein said completing agent includes a first complexing agent of an amphoteric ion type and a second completing agent for enhancing a plating reaction.

42. A method of electroless plating as set forth in claim 35, wherein said processing solution is stored in an atmosphere of an inert gas or ammonia gas until feeding said processing solution to said plating surface.

43. A method of electroless plating as set forth in claim 35, wherein said processing solution is fed to said plating surface in a pressurized atmosphere of an inert gas or ammonia gas.

44. A method of electroless plating as set forth in claim 35, wherein said first metallic material includes at least a compound of nickel or cobalt.

45. A method of electroless plating as set forth in claim 40, wherein said second metallic material includes at least a compound of tungsten or molybdenum.

46. A method of electroless plating as set forth in claim 45, wherein the atomic weight concentration of said tungsten or molybdenum is 0.2 to 2%.

47. A method of electroless plating as set forth in claim 41, wherein said first complexing agent is an amino acid.

48. A method of electroless plating as set forth in claim 41, wherein said second complexing agent is an organic acid.

49. A method of electroless plating as set forth in claim 35, wherein the temperature of said processing solution is adjusted to 50° C. to 95° C.

\* \* \* \* \*